(12) United States Patent
Chao et al.

(10) Patent No.: US 10,973,154 B2
(45) Date of Patent: Apr. 6, 2021

(54) RECONFIGURABLE THERMAL CONTROL OF HIGH-POWERED INTEGRATED CIRCUITRY

(71) Applicant: Intel Corporation, Santa Clara, CA (US)

(72) Inventors: Tong W. Chao, San Jose, CA (US); Prabhakar Subrahmanyam, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 16/336,842

(22) PCT Filed: Sep. 30, 2016

(86) PCT No.: PCT/US2016/054922
§ 371 (c)(1),
(2) Date: Mar. 26, 2019

(87) PCT Pub. No.: WO2018/063377
PCT Pub. Date: Apr. 5, 2018

(65) Prior Publication Data
US 2020/0229325 A1 Jul. 16, 2020

(51) Int. Cl.
*H05K 7/20* (2006.01)
*H02K 11/33* (2016.01)
(Continued)

(52) U.S. Cl.
CPC ..... *H05K 7/20927* (2013.01); *H01L 23/4006* (2013.01); *H01L 23/473* (2013.01);
(Continued)

(58) Field of Classification Search
CPC ...... H01L 2023/4056; H01L 2023/4012; F28F 2215/04
See application file for complete search history.

(56) References Cited

U.S. PATENT DOCUMENTS 3,481,393 A * 12/1969 Chu ............ H01L 23/473
165/80.4
6,116,566 A 9/2000 Brown et al.
(Continued)

FOREIGN PATENT DOCUMENTS

WO 2016065485 A1 5/2016

OTHER PUBLICATIONS

International Search Report and Written Opinion for PCT Application No. PCT/US2016/054922, dated Jun. 30, 2017, 9 pages.

*Primary Examiner* — Mukundbhai G Patel
(74) *Attorney, Agent, or Firm* — Eversheds Sutherland (US) LLP

(57) ABSTRACT

Modular assemblies for thermal management are provided. Modularity permits or facilitates scalable thermal performance with respect to power dissipation demands. Modularity also permits retrofitting a deployed cooling system based at least on a current power dissipation requirement. In some embodiments, a modular assembly can be reversibly reconfigured in order to adjust cooling capacity and fulfill a defined power dissipation target. In some embodiments, a modular assembly can include a liquid-cooled pedestal and multiple liquid-cooled attachment members that can be reversibly coupled to or reversibly decoupled from the liquid-cooled pedestal based at least on a power dissipation condition and/or a change thereof of a dissipative electronic component. The reversible coupling and reversible decoupling of the attachment members can permit or otherwise facilitate reversibly adjusting the heat transfer between the modular assembly and the dissipative electronic component. Scalability of thermal performance of the modular assembly can be achieved, at least in part, by the addition of liquid-cooled attachment members.

17 Claims, 22 Drawing Sheets

(51) Int. Cl.
*H01L 23/40* (2006.01)
*H01L 23/473* (2006.01)

(52) U.S. Cl.
CPC ...... *H02K 11/33* (2016.01); *H01L 2023/4087* (2013.01); *H02K 2211/03* (2013.01)

(56) References Cited

U.S. PATENT DOCUMENTS

| | | |
|---|---|---|
| 2005/0151244 A1 | 7/2005 | Chrysler et al. |
| 2008/0271875 A1 | 11/2008 | Lima |
| 2008/0302509 A1* | 12/2008 | Chen ..................... F21V 29/74 165/80.3 |
| 2012/0085520 A1* | 4/2012 | Pfaffinger ............. H01L 23/427 165/104.26 |
| 2013/0176679 A1 | 7/2013 | Anderl et al. |
| 2014/0036445 A1* | 2/2014 | Okamoto ........... H05K 7/20281 361/697 |
| 2016/0322281 A1* | 11/2016 | Shintani ............ H01L 23/49838 |

* cited by examiner

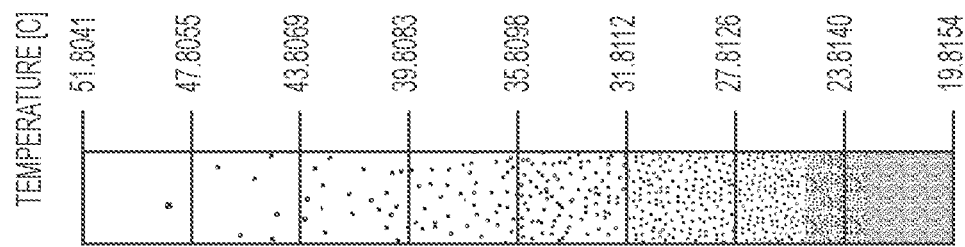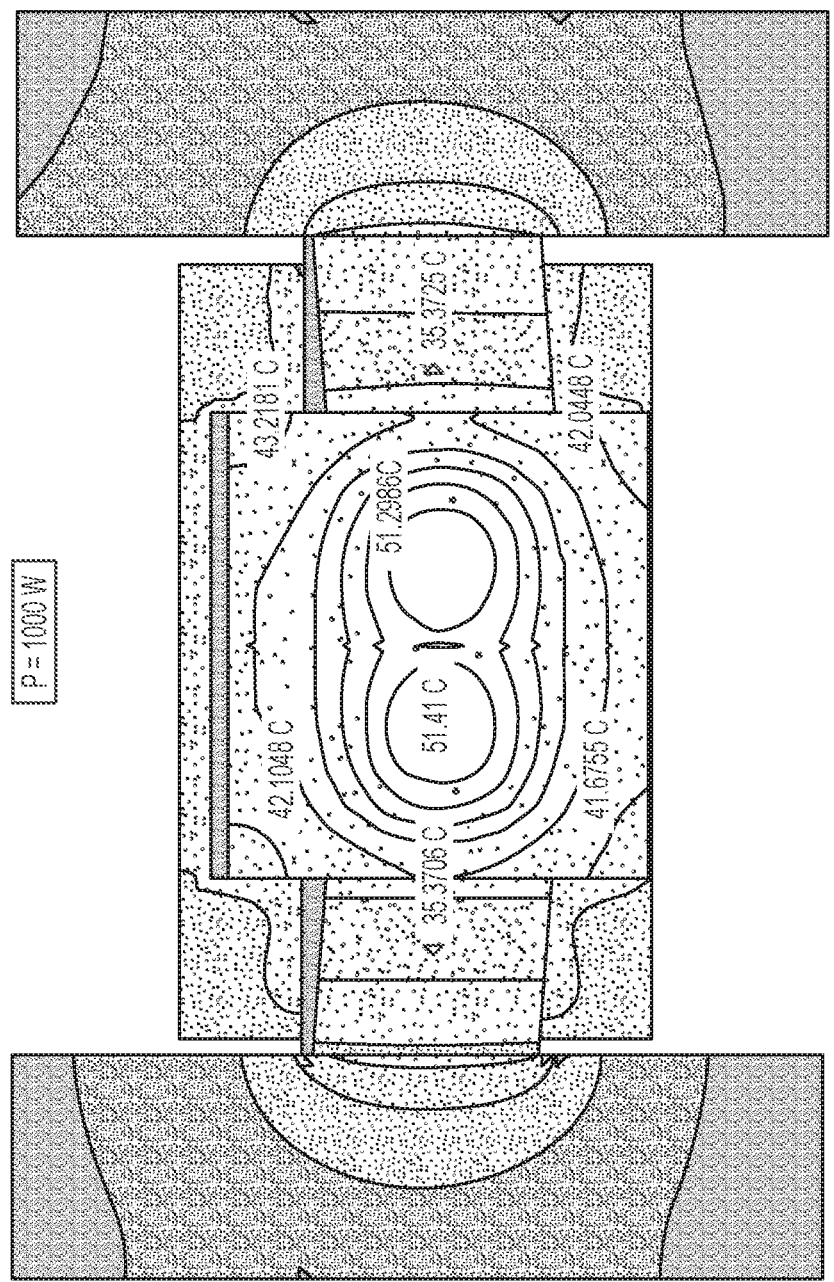
FIG. 12B

| Die Power/IC | Attachment Members Absent | | Attachment Members Present | |
|---|---|---|---|---|
| | $T_P$ | CPU $T_J$ | $T_P$ | CPU $T_J$ |
| 200 W/Dual Die | -2.10 °C | 6.50 °C | -10.72 °C | -2.15 °C |
| 300 W/Dual Die | 12.07 °C | 26.78 °C | -1.57 °C | 13.10 °C |
| 400 W/Dual Die | 26.33 °C | 47.14 °C | 7.58 °C | 28.34 °C |

RECONFIGURABLE THERMAL CONTROL OF HIGH-POWERED INTEGRATED CIRCUITRY

CROSS-REFERENCE TO RELATED APPLICATION(S)

This application is a U.S. National Stage Application under 35 U.S.C. 371 and claims the priority benefit of PCT International Application No. PCT/US2016/054922, filed Sep. 30, 2016, the disclosure of which is incorporated herein by reference as if set forth in full.

BACKGROUND

The structure of integrated circuitry is increasingly getting complicated, with stacked dies and/or multiple die configurations resulting in high-power consumption. Heat dissipation and subsequent heat removal in such high-powered integrated circuitry can be a challenge in terms of adequate thermal design. Typically, cooling and/or controlling the temperature of a semiconductor package containing high-powered circuitry can be achieved by means of a thermal solution that is fixed and cannot be modified after the semiconductor package is deployed. Therefore, much remains to be improved in the design and implementation of thermal solutions for cooling integrated circuits during operation.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, elements, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like, but not necessarily the same or identical, elements throughout.

FIG. 12B illustrates an example of a thermal simulation of the modular assembly shown in FIG. 12A at a dissipated package power of 1000 W in accordance with one or more embodiments of the disclosure. In the illustration of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

DETAILED DESCRIPTION

Figure 1:
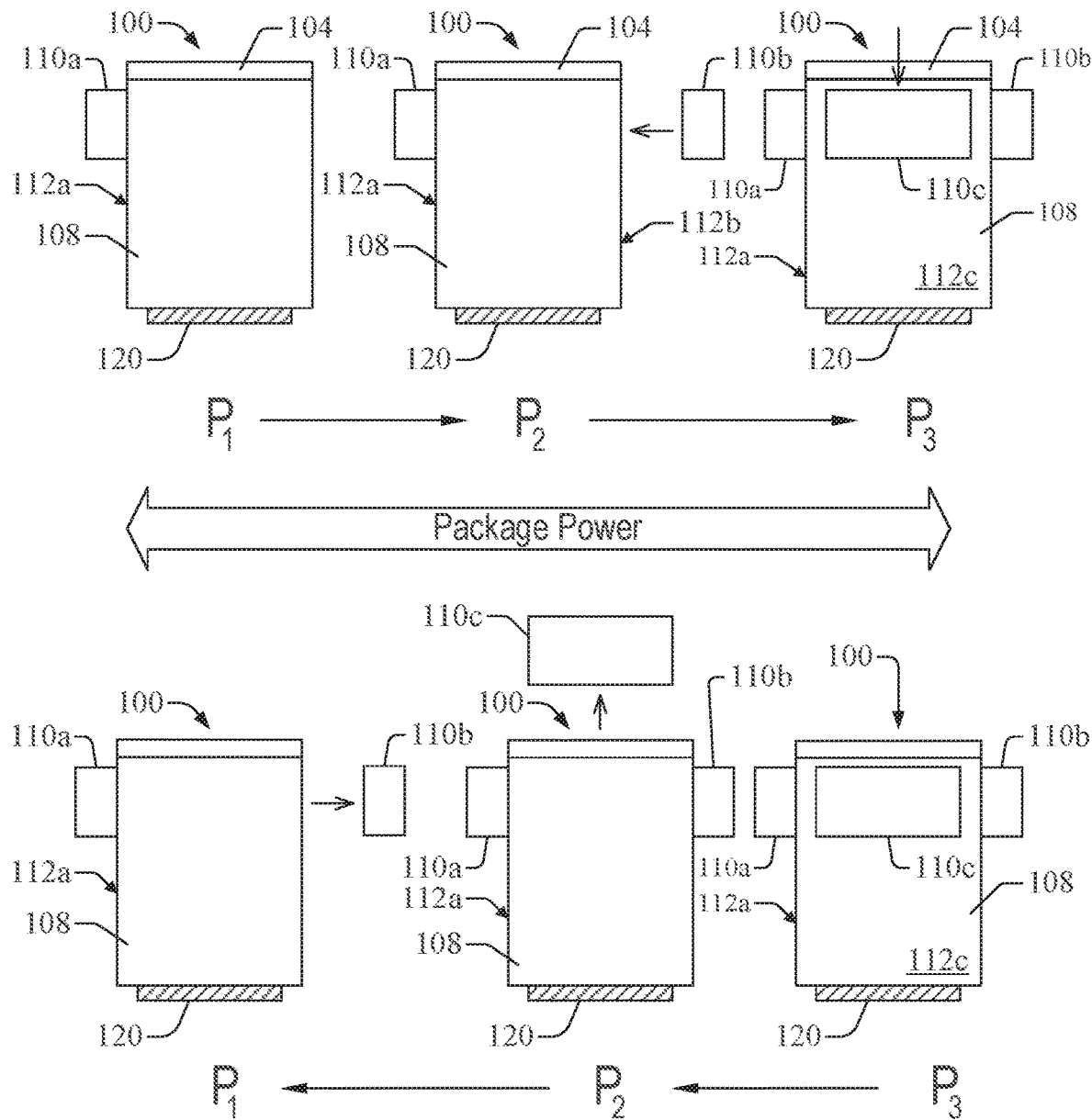
FIG. 1 illustrates a side-view of schematic examples of modular assemblies for thermal control of a semiconductor package in accordance with one or more embodiments of the disclosure.

The disclosure recognizes and addresses, in at least certain aspects, the issue of management of heat dissipation and temperature control in high-powered semiconductor packages. As mentioned, existing solutions have fixed designs and capability way ahead of silicon deployment and is limited by non-scalable thermal performance after silicon deployment. For instance, the maximum power dissipative capacity of a heat sink is typically fixed.

Accordingly, in some aspects, the disclosure provides embodiments of reversibly scalable thermal solutions that permit scalable thermal performance to be added or subtracted based on defined power dissipation requirements after a semiconductor die is installed. To that end, in some embodiments, the disclosure provides modular assemblies for thermal management of a dissipative component. Modularity permits or facilitates scalable thermal performance with respect to power dissipation demands Modularity also permits retrofitting a deployed cooling system based at least on a current power dissipation requirement. In some embodiments, a modular assembly can be reversibly reconfigured in order to adjust cooling capacity and fulfill a defined power dissipation target. In some embodiments, a modular assembly can include a liquid-cooled pedestal and multiple liquid-cooled attachment members that can be reversibly coupled to or reversibly decoupled from the liquid-cooled pedestal based at least on a power dissipation condition and/or a change thereof of a dissipative electronic component. Any coolant liquid having high thermal conductivity, high specific heat, high latent heat of evaporation, and similarly desirable thermodynamic properties can be utilized in such a pedestal or attachment members. The reversible coupling and reversible decoupling of the attachment members can permit or otherwise facilitate reversibly adjusting the heat transfer between the modular assembly and the dissipative electronic component. Scalability of thermal performance of the modular assembly can be achieved, at least in part, by the addition of liquid-cooled attachment members. Therefore, in contrast to conventional thermal solutions, the embodiments of the disclosure can provide thermal solutions that are agile, in that the thermal performance of the thermal solutions is scalable after a semiconductor package is deployed or otherwise configured for operation.

Embodiments of this disclosure can provide several advantages over conventional systems for thermal management of high-powered semiconductor dies. One example advantage includes the configuration of a thermal solution customized to a current target package power rather than a maximum target package power. Customization of the thermal solution can be achieved via the modular arrangement of the thermal solution, rather than the typical static monolithic modular assembly. Another example advantage includes the reconfigurable adaptation of an initial liquid-cooled thermal solution via the addition and/or removal of heat sink material in an existing heat sink present in the initial solution. A configurable and additional thermal head capability to the existing solution can add more leverage in terms of temperature control. Yet another example advantage includes economy of scale—by mass production of the disclosed modular assemblies for thermal control, substantial savings in costs, power, and/or energy can be achieved. Specifically, the modular structure of the modular assemblies in accordance with aspects of the disclosure can permit the deployment of an initial liquid-cooled thermal solution for an initial power dissipation requirement, and subsequent incremental deployments of liquid-cooled attachment members based on increments in power dissipation requirements.

With reference to the drawings, FIG. 1 illustrates a side-view of schematic examples of modular assemblies for thermal control of a semiconductor package including integrated circuitry in accordance with one or more embodiments of the disclosure. In some embodiments, the integrated circuitry can be contained in a semiconductor package 120 that is mechanically coupled and/or thermally coupled to a modular assembly for thermal control of the semiconductor package 120. The integrated circuitry can provide, at least in part, one or more functionalities (e.g., computing, navigation, sensing, a combination thereof, or the like). More specifically, the circuitry can embody or can include microprocessors, microcontrollers, application specific integrated circuits (ASICs), gate arrays, memory devices, digital signal processors (DSPs), programmable logic devices (PLDs), graphics chipsets and/or PC chipsets, a combination of the foregoing, or the like. In some embodiments, the one or more semiconductor dies can be embodied in or can include an array of tiles (which also may be referred to as "core tiles") embodying a high performance computing (HPC) processor architecture that can be utilized in parallel computing. In the HPC processor architecture, each core tile also embodies a processor.

The semiconductor package 120 includes, in some examples, one or more semiconductor dies that can be surface mounted to a package substrate (not depicted) within the semiconductor package 120. The semiconductor package 120 also includes, in some aspects, interconnects (not depicted) that can couple (mechanically and/or electrically) the semiconductor package 120 to a board substrate (not depicted). As such, the board substrate is not included in the semiconductor package 120, and can be embodied in or can include a printed circuit board (PCB), a motherboard, or another type of rigid or semi-rigid platform.

Each (or, in some embodiments, at least one) of the one or more semiconductor dies that can be contained in the semiconductor package 120 can include at least a portion of the integrated circuitry within the semiconductor package 120. Numerous types of interconnects (not depicted in FIG. 1) can permit surface mounting each (or, in some embodiments, at least one) of the one or more semiconductor dies to a package substrate (not depicted) of the semiconductor package 120. To that end, in some aspects, at least a portion of such interconnects can mechanically and/or electrically couple a semiconductor die of the one or more semiconductor dies to the package substrate at conductive pads (e.g., metal pads or metallic pads) placed on a surface of the package substrate. In some embodiments, such interconnects can be embodied in or can include a ball grid array, metal pillars or metal posts, tubular vias, trenches, a combination of the foregoing, or the like. In some embodiments, the semiconductor die also can include a microelectromechanical system (MEMS)—such as a movable diaphragm and a backplate in a microphone, a gyroscope or another type of solid-state accelerometer, and the like that also can permit or otherwise facilitate, at least in part, at least one of the one or more functionalities.

One or more semiconductor dies contained in the semiconductor package 120 can dissipate, individually or collectively, a defined amount of power P (a real number in units of power, such as Watts), which can be referred to as dissipated package power (or, more succinctly, package power or die power). The dissipation of the defined amount of power P can originate from the operation in an energized state, for example, of the one or more semiconductor dies. The defined amount of power P can be dissipated as heat and a modular assembly can be utilized or otherwise leveraged to remove at least a portion of the heat and, thus, to provide thermal control of the semiconductor package 120 or a component (e.g., an electronic device) including the semiconductor package 120. In some embodiments, the modular assembly can be modular, including a cooling tower and one or more attachment members. Each (or, in some embodiments, at least one) of the one or more attachment members can be reversibly or otherwise removably mounted to the cooling tower 100, and can be configured to receive an amount of heat from the cooling tower. In addition, a number (or a quantity) of the one or more attachment members can be determined based at least on a configurable target for power dissipation of the semiconductor package. More specifically, as illustrated in FIG. 1, such a modular assembly can include a cooling tower 100 including a pedestal member 108 having a top surface and a bottom surface opposite to the top surface. In one aspect, the bottom surface can be configured to receive an amount of heat from the semiconductor package 120. To that end, in some aspects, the bottom surface can be thermally coupled to the semiconductor package 120. The pedestal member 108 can be formed from or can include a thermally conductive material. In some embodiments, the thermally conductive material can include one or more of stainless steel, copper, aluminum, zinc, or an alloy of two or more of the foregoing metals.

In addition, the cooling tower 100 also includes a cold plate 104 mechanically coupled and thermally coupled to the pedestal member 108. More specifically, the cold plate 104 can be configured to receive an amount of heat from the pedestal member 108, and thus, the cold plate 104 can remove or can facilitate removing heat from the semiconductor package 120. To at least such an end, in some aspects, the cold plate 104 can include a first surface defining an inlet opening and an outlet opening (neither of the openings depicted in FIG. 1), where the inlet opening can be coupled to first tubing and the outlet opening can be coupled to second tubing. The first tubing and the second tubing (neither depicted in FIG. 1) are configured to transport coolant liquid, such as process chilled water, a mixture of methanol and water, another mixture of ethanol and water, or the like. It is noted that the disclosure is not limited to a particular type of cold plate, and most any type of cold plates can be contemplated or otherwise leveraged in the embodiments of this disclosure.

As mentioned, attachment member(s) can be reversibly mounted to or reversibly dismounted from a cooling tower of a modular assembly in accordance with aspects of the disclosure. More specifically, in some embodiments, one or more attachment members can be removably mounted to respective one or more side surfaces of the pedestal member 108. Each (or, in some embodiments, at least one) of the one or more attachment members can be formed from or can include a respective thermally conductive material. In some embodiments, the respective thermally conductive material can include one or more of copper, stainless steel, aluminum, zinc, or an alloy of two or more of the foregoing metals. In addition, each (or, in some embodiments, at least one) of the one or more attachment members can be configured to receive a respective amount of heat from the pedestal member 108. To that end, in some aspects, a surface of an attachment member can be thermally coupled to a side surface of the pedestal member 108. In one embodiment, a first attachment member of the one or more attachment members can include a base member removably mounted to a side surface of the one or more side surfaces of the pedestal member 108. In one example, as illustrated in FIG. 1, an attachment member 110a can be reversibly mounted (or otherwise removably mounted) to a side surface 112a of the pedestal member 108. In addition, the attachment member 110a can include a base member (not depicted in FIG. 1) having a first surface and a second surface substantially orthogonal to the first surface. In some aspects, the first surface can define openings configured to receive respective fastening members (e.g., screws, bolts, pins, a combination thereof, or the like), where at least one of the respective fastening members removably couples (e.g., reversibly mounts) the base member to the pedestal member 108. In addition or in another embodiment, the first attachment member (e.g., attachment member 110a) can include a cold plate (not depicted) mounted on a surface of the first attachment member. The surface can define an inlet opening and an outlet opening, where the inlet opening is coupled to first tubing and the outlet opening is coupled to second tubing. The first tubing and the second tubing can be configured to transport coolant liquid, such as process chilled water, a mixture of methanol and water, another mixture of ethanol and water, or the like.

As mentioned, a defined package power can determine a number of attachment members that can be mounted to the cooling tower 100 of a modular assembly for thermal management of the semiconductor package 120. The defined package power can be, for example, an intended or otherwise expected amount of power to be dissipated by one or more semiconductor dies at the semiconductor package 120—e.g., 200 W, 300 W, 400 W, 800 W, or 1000 W. In addition, in view that an attachment member (e.g., attachment member 110a) can be removably coupled to the cooling tower 100, the heat extraction capacity of the modular assembly can be adjusted based at least on changes in the defined package power. Therefore, as mentioned, the modular assembly is reconfigurable or otherwise agile with respect to changes in dissipated power at the semiconductor package 120. As an illustration, FIG. 1 presents a modular assembly for thermal control of a package power $P_1$ (e.g., 200 W) including the cooling tower 100 and the attachment member 110a. In some instances, operational condition of the semiconductor package 120 can change, causing a transition from package power $P_1$ to package power $P_2$ (e.g., 400 W), where $P_2 > P_1$. In other instances, the semiconductor package 120 may be replaced, with the ensuing replacement of semiconductor die(s) therein, causing a change in the requirement for power dissipation. Regardless of the particular source of the transition from $P_1$ to $P_2$, an attachment member 110b can be removably coupled to (e.g., reversibly mounted on) a side surface 112b of the pedestal member 108, resulting in an upgraded or otherwise reconfigured modular assembly that can cool the semiconductor package 120 and/or can keep the temperature of the semiconductor package 120 within a defined specification at power package $P_2$. The structure of the attachment member 110b can be the same or different from the structure of the attachment member 110a. In some implementations, the addition of the attachment member 110c can be automated via a robotic arm or a similar apparatus (neither one depicted in FIG. 1).

Other changes can occur (e.g., change in operational condition, change in architecture, etc.), the changes causing package power to transition from $P_2$ to $P_3$ (e.g., 600 W), where $P_3 > P_2$. In response, additional heat removal capacity can be added; for example, an attachment member 110c can be removably coupled to (e.g., reversibly mounted on) a side surface 112c of the pedestal member 108, resulting in an upgraded modular assembly that can cool the semiconductor package 120 and/or can keep the temperature of the semiconductor package within a defined specification at power package $P_3$. The structure of the attachment member 110b can be the same or different from the structure of either the attachment member 110a or the attachment member 110b. In some implementations, the addition of the attachment member 110c can be automated via a robotic arm or a similar apparatus. Accordingly, by reversibly adding the attachment member 110a and the attachment member 110b, the cooling tower 100 can be upgraded or otherwise reconfigured to remove heat under increasingly higher power dissipation conditions. It is noted that the transitions from $P_1$ to $P_2$ and from $P_2$ to $P_3$ can occur at most any time scale, e.g., seconds, minutes, hours, days, weeks, months, years, and the like.

Reconfiguration of a modular assembly in accordance with aspects of the disclosure is reversible, which can permit responding to changes in package power that may result in a lesser heat removal requirement. As such, rather than operating at excessive or otherwise non-optimal heat removal capacity, the modular assembly can be reconfigured to utilize satisfactory amounts of resources (e.g., energy, coolant fluid, etc.) for heat removal. A satisfactory amount can refer to an optimal amount, a nearly optimal amount, or another amount that satisfies a defined criterion, such as a defined likelihood of reclamation of the resource, a defined cost, a defined energy consumption rating, a combination thereof, or the like. As illustrated in FIG. 1, subsequent removal of attachment members can be responsive to corresponding subsequent decrements in package power. Specifically, in one example, a transition from $P_3$ to $P_2$ can be accommodated by reversibly removing the attachment member 110c from the pedestal member 108. In another example, a transition from $P_2$ to $P_1$ can be accommodated by reversibly removing the attachment member 110b from the pedestal member 108. In some implementations, the removal of the attachment member 110c and/or the attachment member 110b can be automated via a robotic arm or a similar apparatus.

Figure 2:
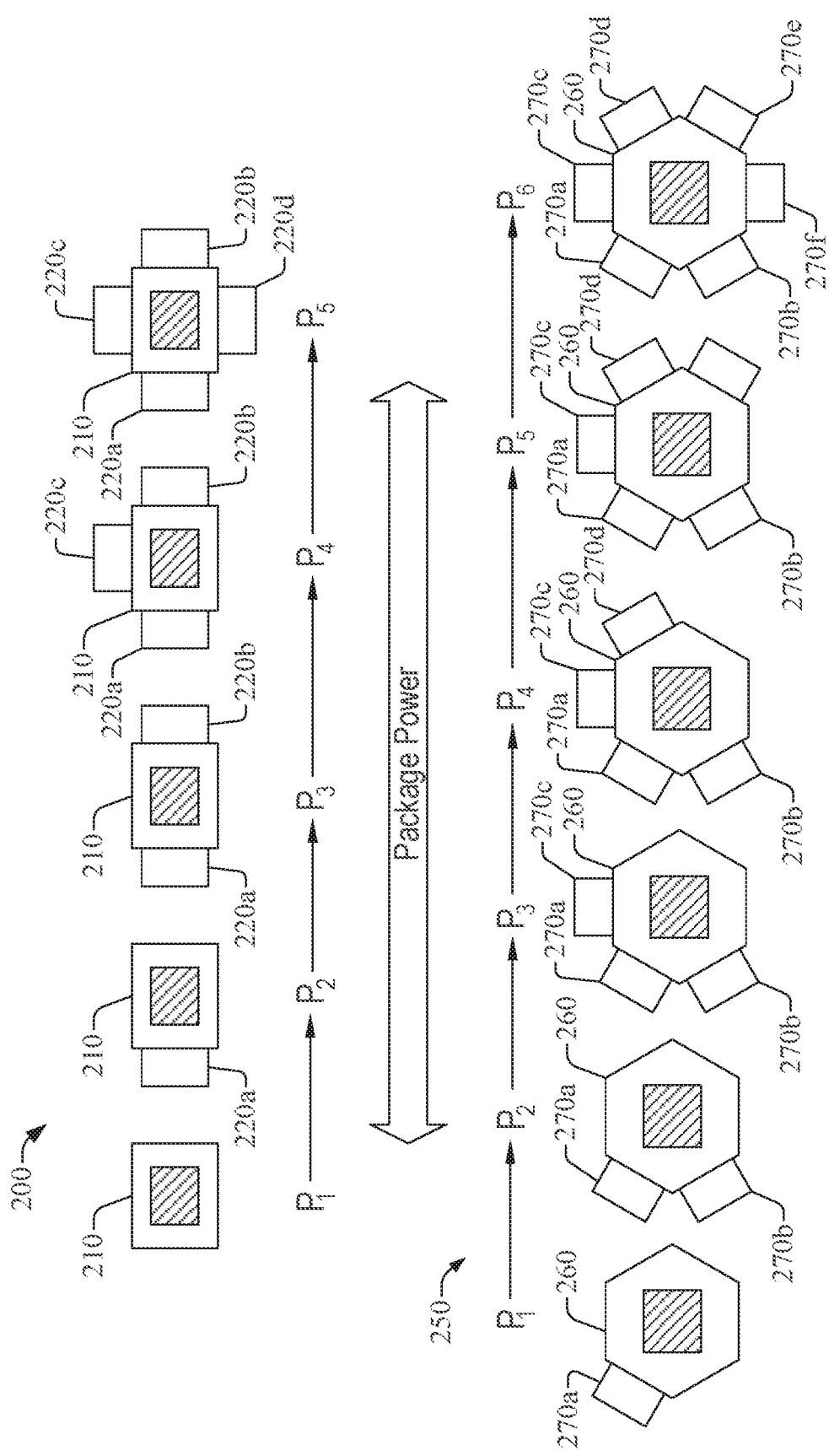
FIG. 2 illustrates a bottom-view of schematic examples of assemblies for thermal control in accordance with one or more embodiments of the disclosure.

It is noted that a maximum number of attachment members that can be removably coupled to (e.g., reversibly mounted on) the cooling tower 100 can determine a total number of transitions between package powers that can be controlled by reversibly adding an attachment member to the cooling tower 100 and/or reversibly removing another attachment member from the cooling tower 100. As an illustration, FIG. 2 depicts a bottom-view of examples of schematic thermal control assemblies in accordance with one or more embodiments of the disclosure. Diagram 200 illustrates a cooling tower having a pedestal member 210 of rectangular cross-section. Accordingly, up to four attachment members 220a, 220b, 220c, and 220d can be removably coupled to the pedestal member 210. Diagram 250 illustrates a cooling tower having a pedestal member 260 of hexagonal cross-section. Accordingly, up to six attachment members 270a, 270b, 270c, 270d, 270e, and 270f can be removably coupled to the pedestal member 260, and thus, up to five package power transitions can be accommodated: (1) $P_1$ to $P_2$, (2) $P_2$ to $P_3$, (3) $P_3$ to $P_4$; (4) $P_4$ to $P_5$, and (5) $P_5$ to $P_6$. Therefore, the number of side surfaces available in the pedestal member 260 can permit fulfillment of finer changes in dissipation requirements, and therefore, greater scalability. In some embodiments, a circular pedestal member can permit concentric addition of cylindrical sections and/or sleeves mounted to the surface of the pedestal member. Therefore, even finer changes in dissipation requirements can be accommodated for such a pedestal member.

With further reference to FIG. 1, while not depicted therein, in some embodiments, the cooling tower 100 can include a Peltier device mounted on the top surface of the pedestal member 108, and thermally coupled to the cold plate 104 and the pedestal member 108. Similarly, at least one of the attachment members that can be removably mounted to the pedestal member 108 also can include a respective Peltier device mounted on a respective surface of the at least one of the attachment members. Incorporation of one or more Peltier devices in a modular assembly including the cooling tower 100 can permit or otherwise facilitate temperature control of the semiconductor package 120. In particular, yet not exclusively, the Peltier device (either custom-made or off-the-shelf) can provide temperature margining capability for the semiconductor package 120. In some aspects, implementation of temperature margining at low temperatures can permit or otherwise facilitate electrical performance testing of a semiconductor die that can be included in the semiconductor package 120. As such, the temperature margining capability can permit expediting the discovery of operational issues in the semiconductor package 120. In some implementations, a Peltier device included in a modular assembly in accordance with aspects of the disclosure can be controlled using a bench top proportional-integral-derivative (PID) controller or most any other type of controller, such as a programmable logic controller.

Figure 3:
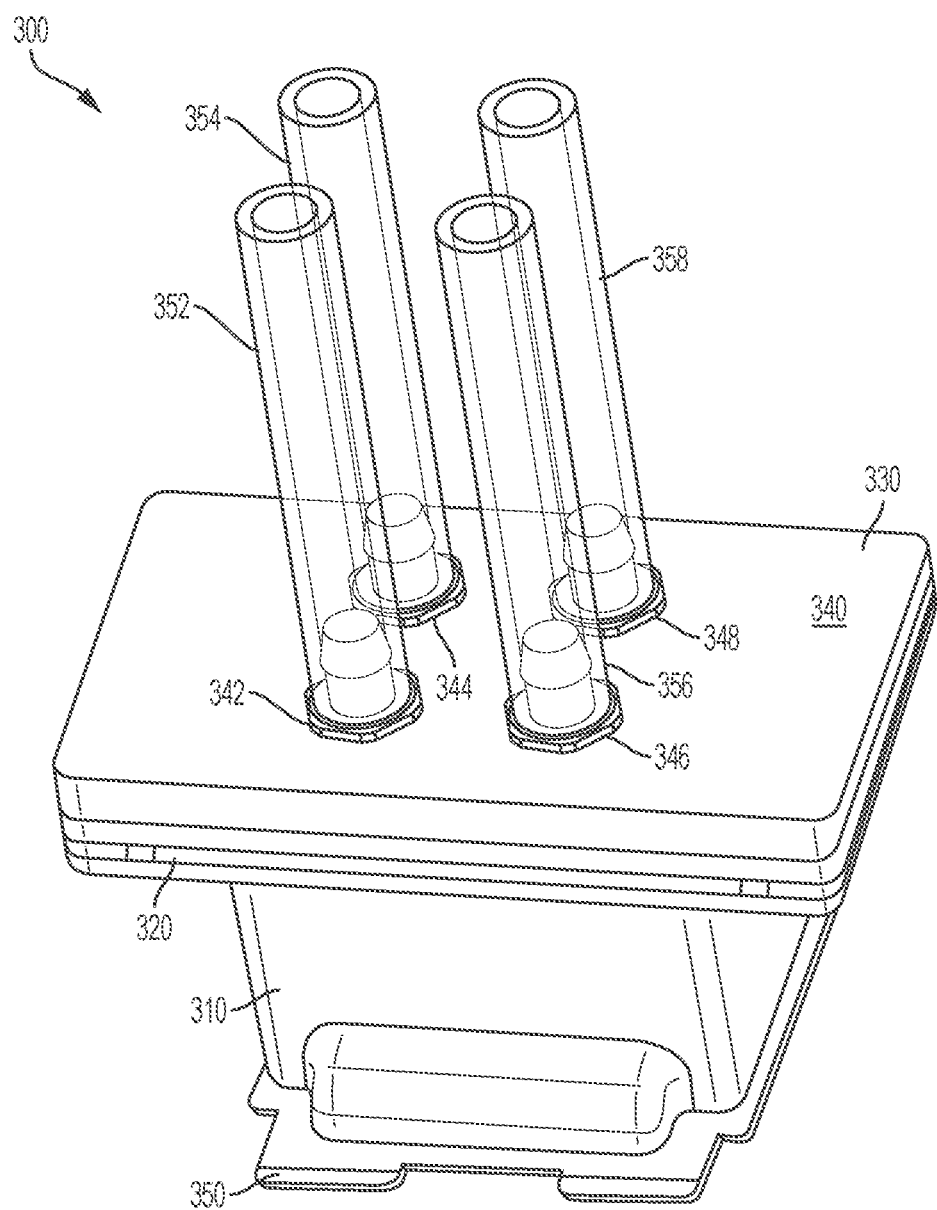
FIG. 3 illustrates a perspective view of an example of a modular assembly for thermal control in accordance with one or more embodiments of the disclosure.

FIG. 3 illustrates a perspective view of an example of a modular assembly 300 for thermal control in accordance with one or more embodiments of the disclosure. The modular assembly 300 includes a pedestal member 310 mechanically coupled and thermally coupled to a semiconductor package. As illustrated, in some embodiments, the pedestal member 310 can be mechanically and/or thermally coupled to a semiconductor package 350. The modular assembly 300 also includes a Peltier device 320 and a cold plate 330. As illustrated, the cold plate 330 includes a surface 340 that defines a plurality of openings including a first inlet opening 342 and a second inlet opening 344, and a first outlet opening 346 and a second outlet opening 348. Each of the inlet openings 342 and 344 is configured to receive tubing 352 and 354 to carry coolant liquid into the cold plate 330. The coolant liquid can circulate through one or more channels configured in a defined arrangement based on a type of the cold plate 330. Similarly, each of the outlet openings 346 and 348 is configured to receive other tubing 356 and 358 to carry the coolant liquid out of the cold plate 330.

Figure 4:
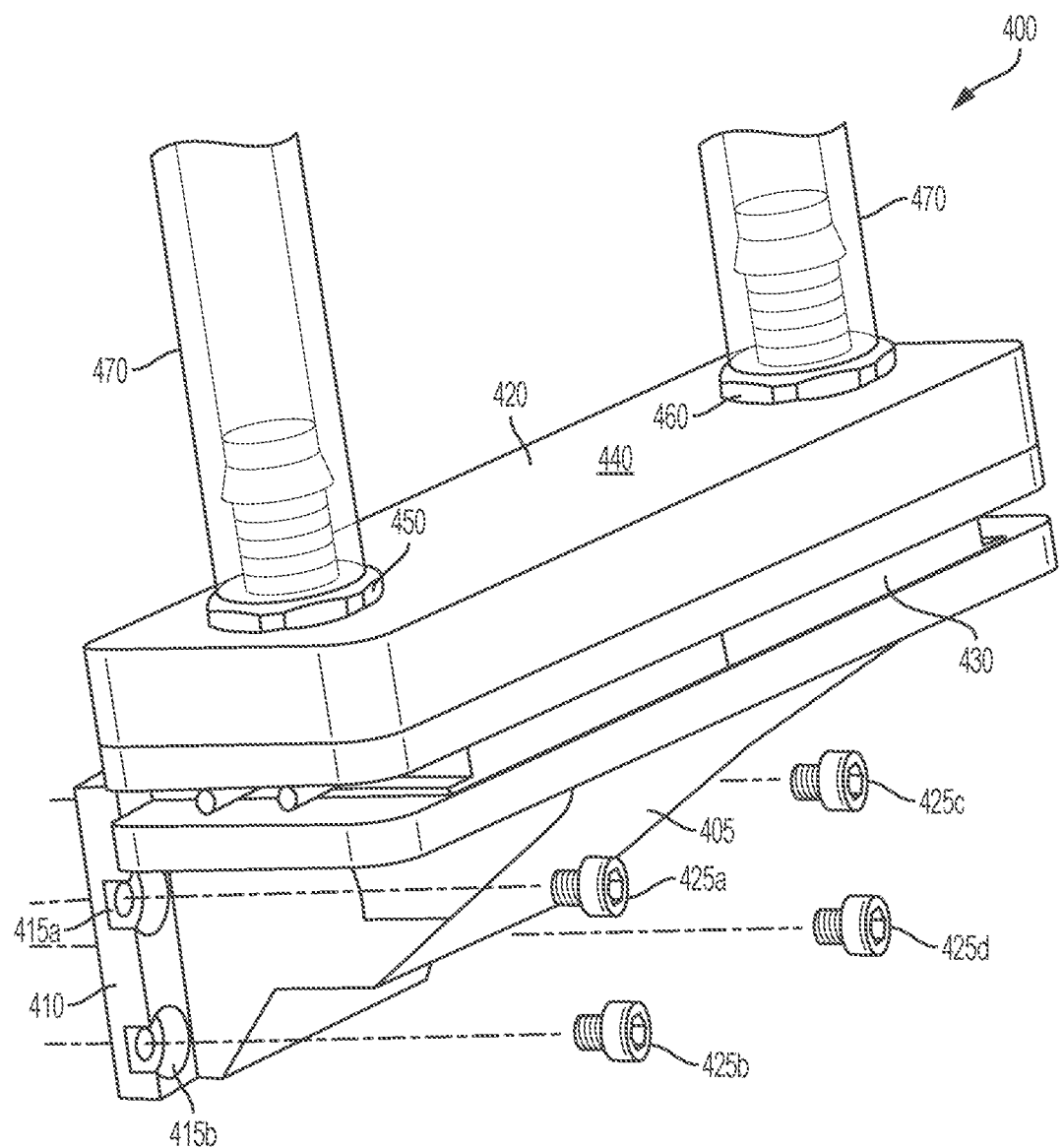
FIG. 4 illustrates an example of an attachment member in accordance with one or more embodiments of the disclosure.

FIG. 4 illustrates an example of an attachment member 400 in accordance with one or more embodiments of the disclosure. As illustrated, the attachment member 400 includes a base member 405 having two flanges, each defining two openings (e.g., two through holes) configured to receive respective fastening elements (e.g., screws, bolts, pins, or the like). As an illustration, four screws 425a, 425b, 425c, and 425d are shown. In the illustrated view, a flange 410 is visible, whereas the other flange is not visible. As illustrated, the flange 410 defines an opening 415a and an opening 415b. As mentioned, in one example, the opening 415a is configured to receive the screw 425a, and the opening 415b is configured to receive the screw 425b. The attachment member 400 also includes a cold plate 420 and a Peltier device 430 mechanically and thermodynamically coupled to a surface of the cold plate 420 and another surface of the base member 405. The cold plate 420 has a surface 440 that defines a first opening 450 and a second opening 460, each of which openings is configured to receive tubing 470 to carry coolant liquid. In some embodiments, the first opening 450 embodies an inlet opening and the second opening 460 embodies an outlet opening. As such, in those embodiments, the first opening 450 is configured to receive the tube 470 (or any other type of conduit) that can carry coolant liquid into the cold plate 420. The second opening 460 is configured to receive the tube 480 (or any other type of conduit) that can carry coolant liquid out of the cold plate 420.

Figure 5:
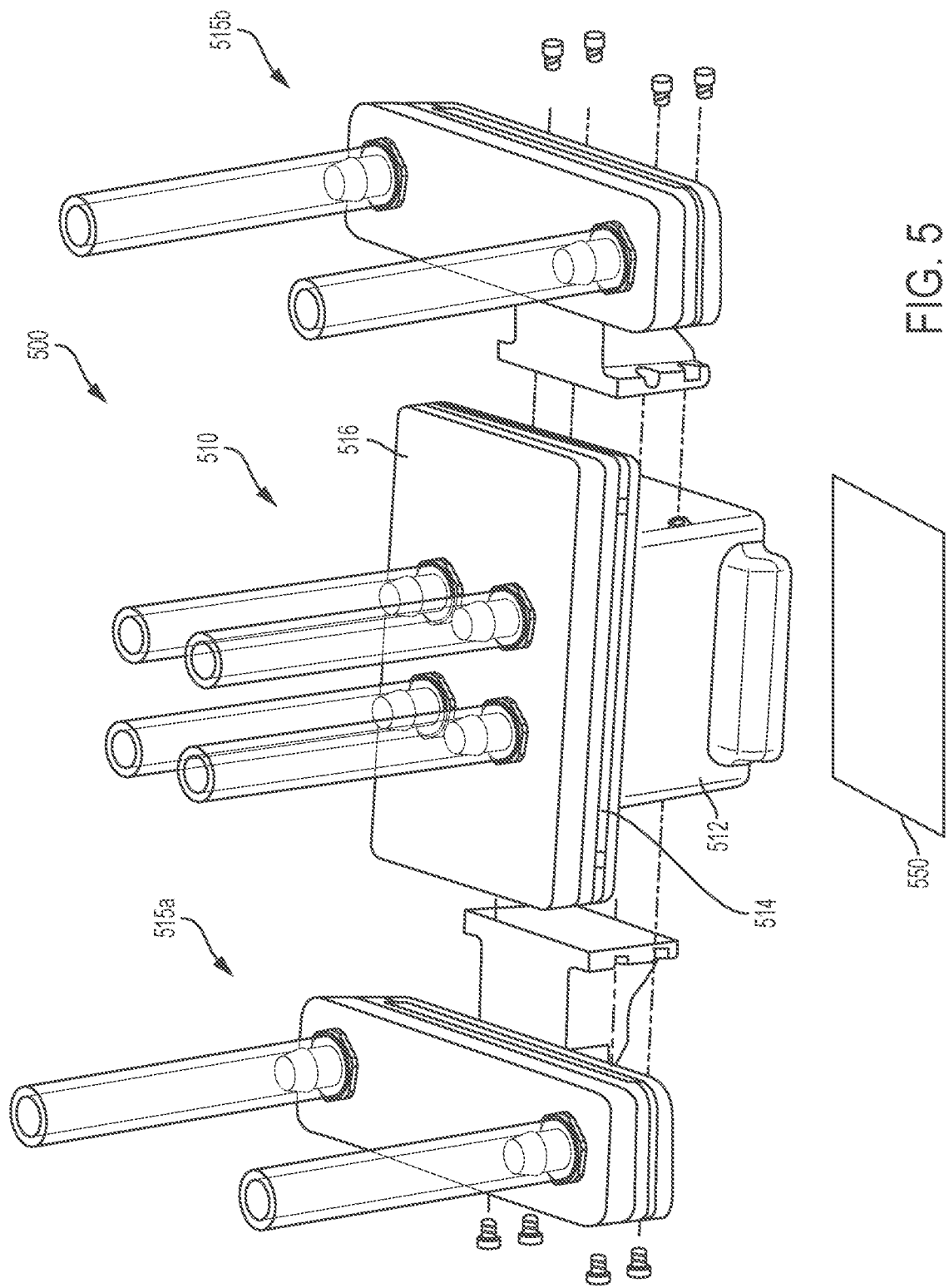
FIG. 5 illustrates a perspective view of an example of a modular assembly for thermal control in accordance with one or more embodiments of the disclosure.

FIG. 5 illustrates a deconstructed perspective view of an example of a modular assembly 500 for thermal control in accordance with one or more embodiments of the disclosure. The modular assembly 500 includes a cooling tower 510. As illustrated, the cooling tower 510 includes a pedestal member 512, a Peltier device 514, and a cold plate 516. Similar to other modular assemblies in accordance with aspects of this disclosure, the cold plate 516 includes a surface that defines two first openings and two second openings (e.g., outlet openings). In some embodiments, each of the first openings can embody inlet openings configured to receive first tubing to carry coolant liquid into the cold plate 516. In addition, each of the second openings can embody outlet openings configured to receive second tubing to carry the coolant liquid out of the cold plate 516. The modular assembly 500 also includes an attachment member 515a and an attachment member 515b, each of which members can be reversibly mounted on (or otherwise removably coupled to) the pedestal member 512. In the illustrated embodiment, each of the attachment member 515a and the attachment member 515b can have a structure corresponding or otherwise similar to the structure of the attachment member 400 described herein. The modular assembly 500 can be mechanically coupled and thermally coupled to a semiconductor package 550 (schematically depicted) including integrated circuitry arranged in one or more semiconductor dies. The semiconductor package can be surface mounted on a board platform (e.g., a motherboard, a PCB, or the like).

Figure 6:
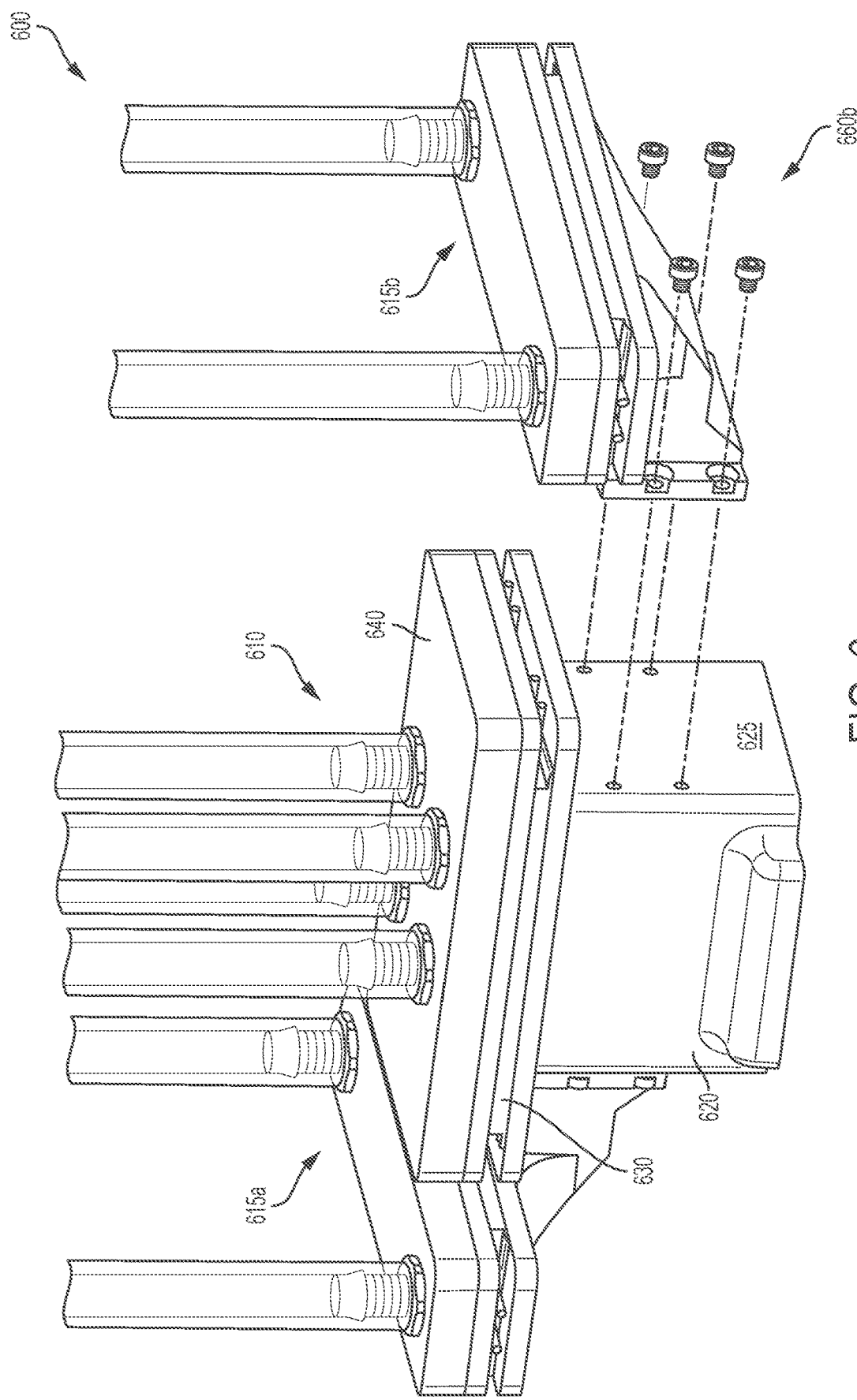
FIG. 6 illustrates a perspective view of another example of a modular assembly in accordance with one or more embodiments of the disclosure.

FIG. 6 illustrates a deconstructed perspective view of an example of a modular assembly 600 in accordance with one or more embodiments of the disclosure. Similar to other modular assemblies in accordance with aspects of this disclosure, the modular assembly 600 includes a cooling tower 610 and an attachment member 615a. The cooling tower 610 includes a pedestal member 620, a Peltier device 630, and a cold plate 640 in accordance with various aspects described herein. As illustrated, a second attachment member 615b is shown as being configured to be coupled (e.g., mechanically coupled and thermally coupled) to a surface 625 of the pedestal member 620. In the illustrated embodiment, each of the attachment member 615a and the attachment member 615b can be reversibly mounted on (or otherwise removably coupled to) the pedestal member 620, and can have a structure corresponding or otherwise similar to the structure of the attachment member 400 described herein. The surface 625 defines a plurality of openings (e.g., a plurality of blind holes), each configured to receive a respective fastening member of a plurality of fastening members 660b. More specifically, as illustrated in FIG. 6, the surface 625 defines four openings (e.g., four blind holes). Similarly, the attachment member 615a is reversibly mounted on (or otherwise removably coupled to) another side surface of the pedestal member 620, the other side surface opposite to the surface 625. In one aspect, the other side surface also defines a plurality of openings (e.g., a plurality of blind holes) each configured to receive a respective fastening member of a plurality of fastening members that can reversibly affix the attachment member 615a to the pedestal member 620.

Figure 7A:
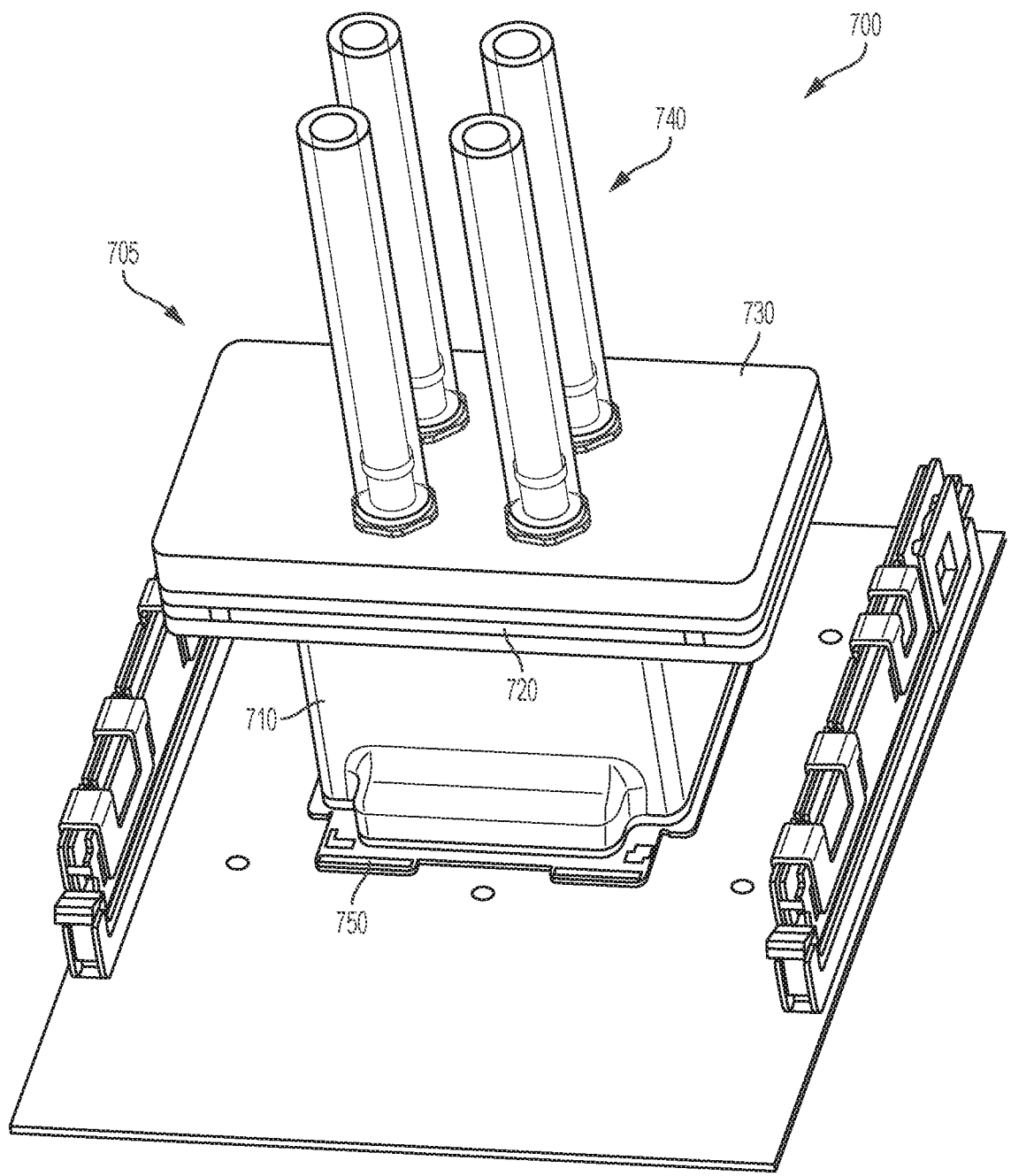
FIG. 7A illustrates an example of a modular assembly, without attachment members, in accordance with one or more embodiments of the disclosure.

FIG. 7A illustrates an example of a system 700 including the modular assembly 705 in accordance with one or more embodiments of the disclosure. The system 700 can dissipate power in response to the operation of integrated circuitry contained in one or more semiconductor dies (not depicted) packaged in a semiconductor package 750. As mentioned, in some embodiments, the one or more semiconductor dies, individually or in combination, can embody or can include an HPC processor architecture that can be utilized in parallel computing. As illustrated, the modular assembly 705 includes a pedestal member 710, a Peltier device 720, and a cold plate 730 having tubing 740 mechanically coupled and fluidically coupled to the cold plate 730.

The pedestal member 710 can be coupled, e.g., mechanically coupled, thermally coupled, and/or electrically coupled, to the semiconductor package 750. For instance, a surface of the pedestal member 710 can be in thermal contact with another surface of the semiconductor package 750, such as an outer layer of molding or a ceramic material that encases the integrated circuitry. Thus, in one aspect, the surface of the pedestal 710 can be configured to receive an amount of heat from the semiconductor package 750. The modular assembly 705 does not include attachment thermal members (e.g., attachment member 400) in accordance with aspects of this disclosure.

Figure 7B:
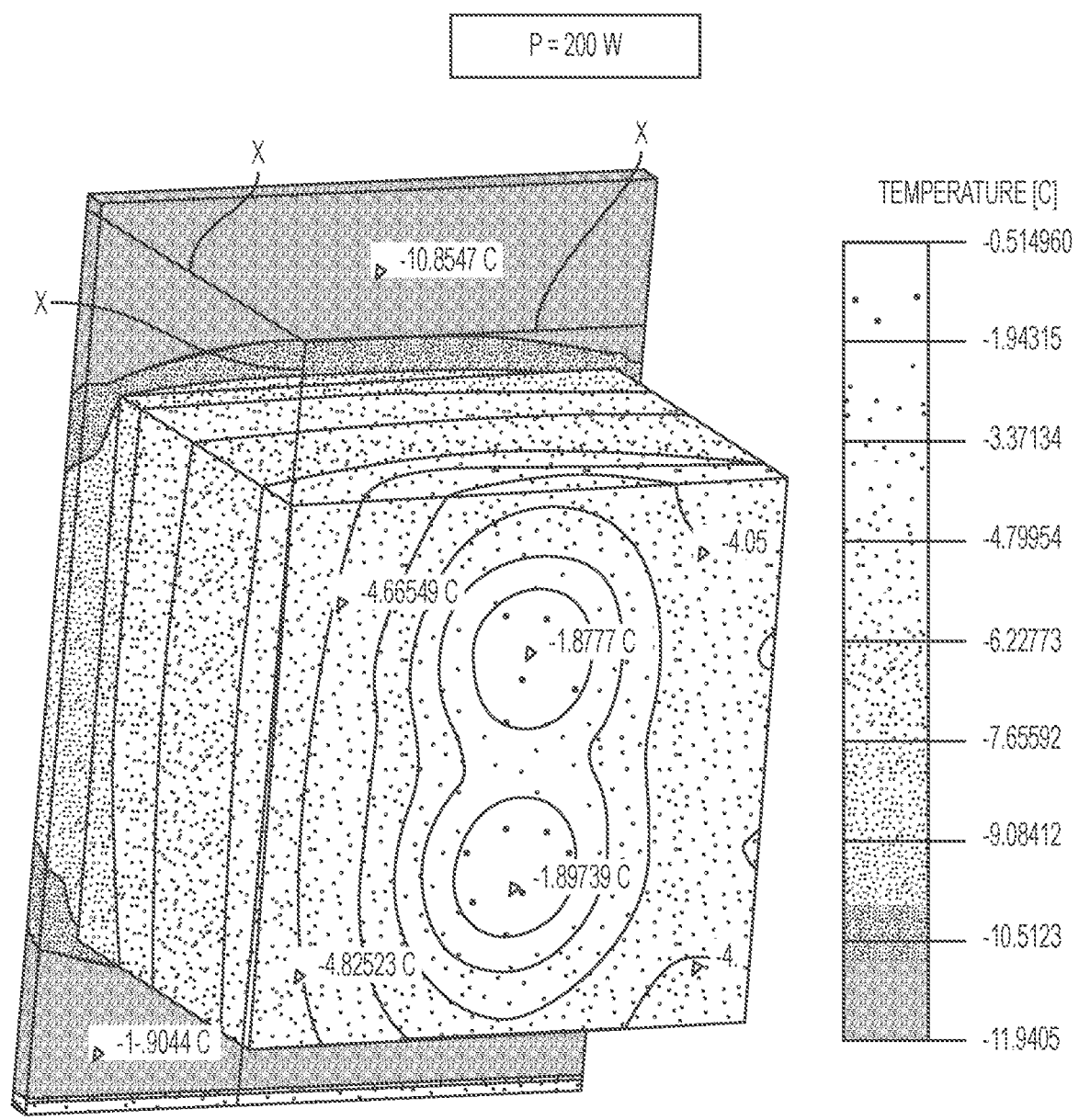
FIG. 7B illustrates an example of thermal simulations of the modular assembly of FIG. 7A at a dissipated package power of 200 W in accordance with one or more embodiments of the disclosure. In the illustrations of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

In one scenario, the semiconductor package 750 can be configured to dissipate a power of 200 W. For instance, two semiconductor dies within the semiconductor package 750 can be energized, dissipating 200 W. FIG. 7B illustrates an example of a thermal simulation of the pedestal member 710 at the dissipated package power of 200 W. As mentioned, in the illustration of these simulation results and other simulation results described herein, temperatures are shown in degree Celsius, and are shown as a spatial temperature distribution in which regions at a lower temperature are represented with a denser distribution of dots and other regions at higher temperatures are represented with a less dense (or more sparse) distribution of dots. Contour lines separate regions of different temperature, unless clarity of the illustration is hindered. As it can be gleaned from the simulations, due to the symmetry of the pedestal member 710 and the symmetrical placement of the two semiconductor dies, the distribution of temperatures is nearly symmetric. Each of the semiconductor dies embodies a heat source and, as such, the temperature in the vicinity of the dies is highest (e.g., about −1.9° C. in the simulation). Regions corresponding to the flanges of the pedestal member 710 are predicted to have temperatures of about −10.9° C.

Figure 8A:
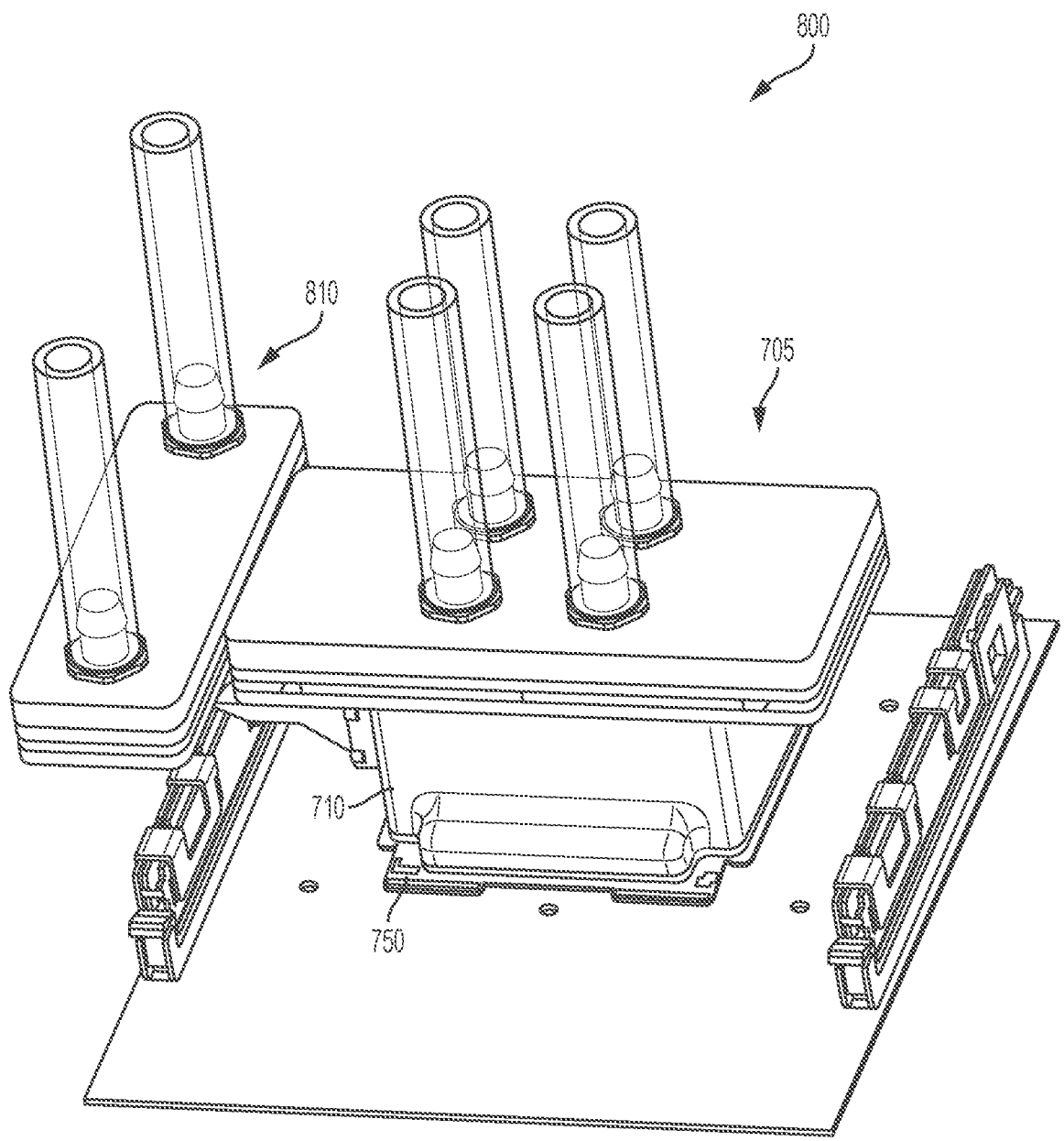
FIG. 8A illustrates another example of a modular assembly having a modular attachment member in accordance with one or more embodiments of the disclosure.
Figure 8B:
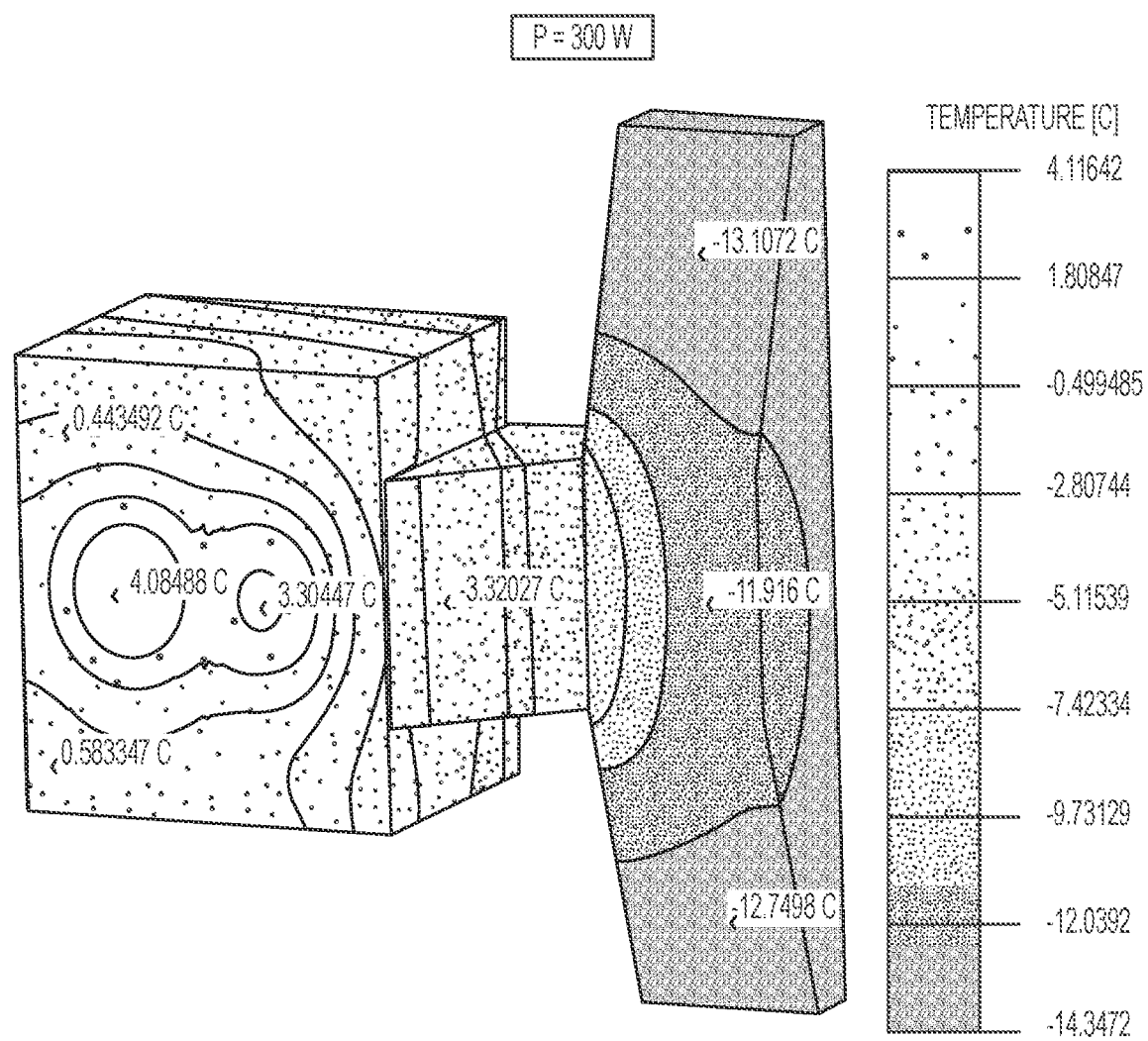
FIG. 8B illustrates an example of a thermal simulation of the modular assembly shown in FIG. 8A at a dissipated package power of 300 W, in accordance with one or more embodiments of the disclosure. In the illustration of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

In a scenario in which the dissipated package power increases to 300 W (e.g., additional components are energized in a semiconductor die of the semiconductor package 750), one thermal attachment member 810 can be coupled (e.g., mechanically coupled and/or thermally coupled) to the modular assembly 705. Specifically, the thermal attachment member 810 can be mounted on the pedestal member 710, where a surface of thermal member 910 abuts, or is otherwise in contact with, a surface of the pedestal member 710, as is shown in FIG. 8A. The structure of the thermal attachment member 810 can be the same or similar to the structure of the attachment member 400 discussed herein. The addition of the thermal attachment member 810 results in a modular assembly 800 having greater thermal dissipation capacity than the modular assembly 700. FIG. 8B illustrates results of a thermal simulation of the modular assembly 800.

Figure 9A:
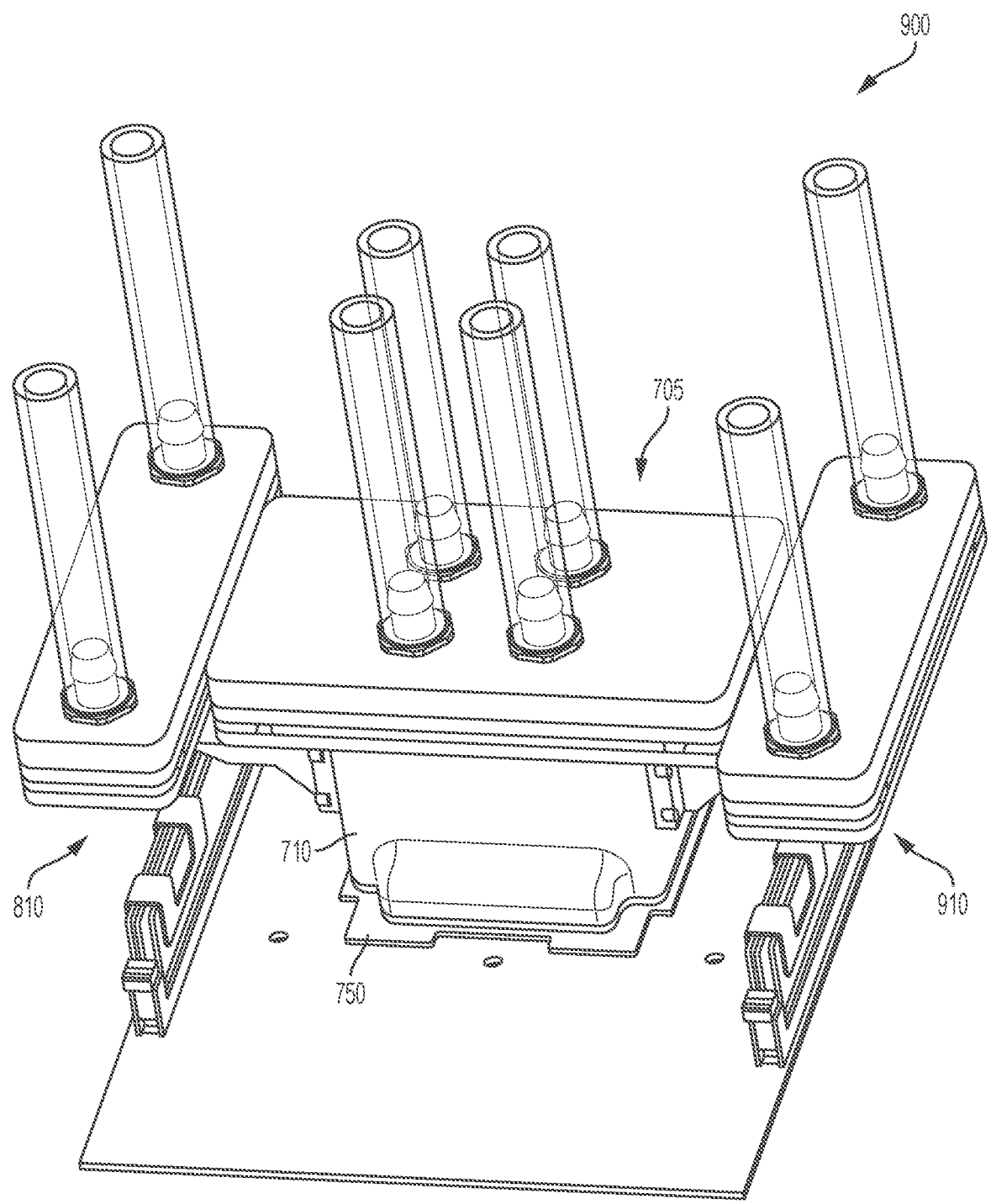
FIG. 9A illustrates yet another example of a modular assembly having two modular attachment members in accordance with one or more embodiments of the disclosure.
Figure 9B:
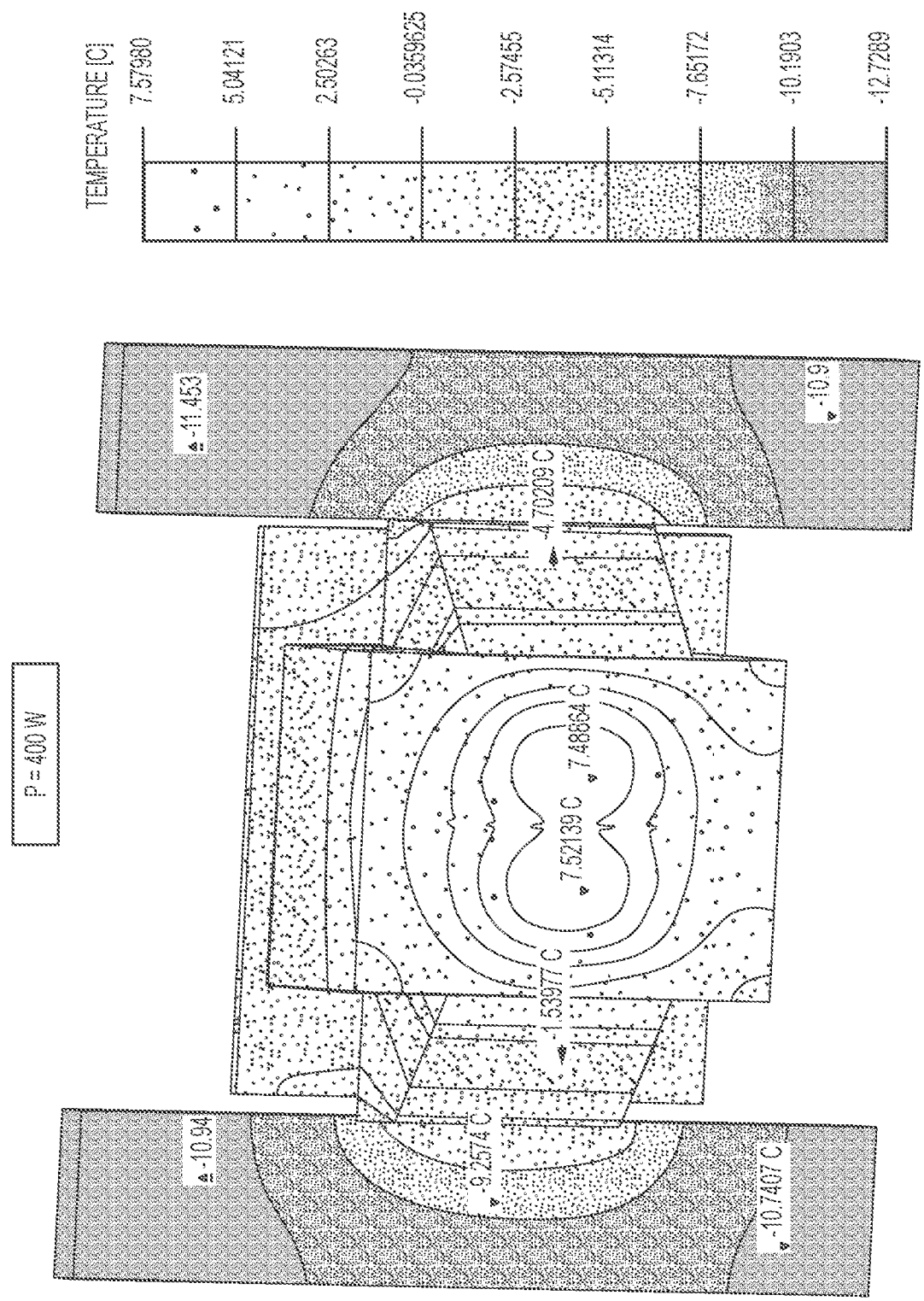
FIG. 9B illustrates an example of a thermal simulation of modular assembly shown in FIG. 9A at a dissipated package power of 400 W in accordance with one or more embodiments of the disclosure. In the illustrations of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

In another scenario in which the dissipated package power increases to 400 W (e.g., further components are energized in another semiconductor die of the semiconductor package 750), two modular attachment members can be coupled to the modular assembly 705, as is shown in FIG. 9A. Such modular attachment members also can be referred to as modular thermal attachment members. The addition (e.g., the mounting or otherwise mechanical coupling) of the modular attachment member 910 and the modular attachment member 810 to the modular assembly 705 results in a modular assembly 900 for thermal control of the semiconductor package 750 at a dissipated power of 400 W. In some embodiments the structure of the modular attachment member 910 can be the same as or similar to the structure of the modular attachment member 810. FIG. 9B illustrates results of a thermal simulation of the modular assembly 900.

Figure 10:
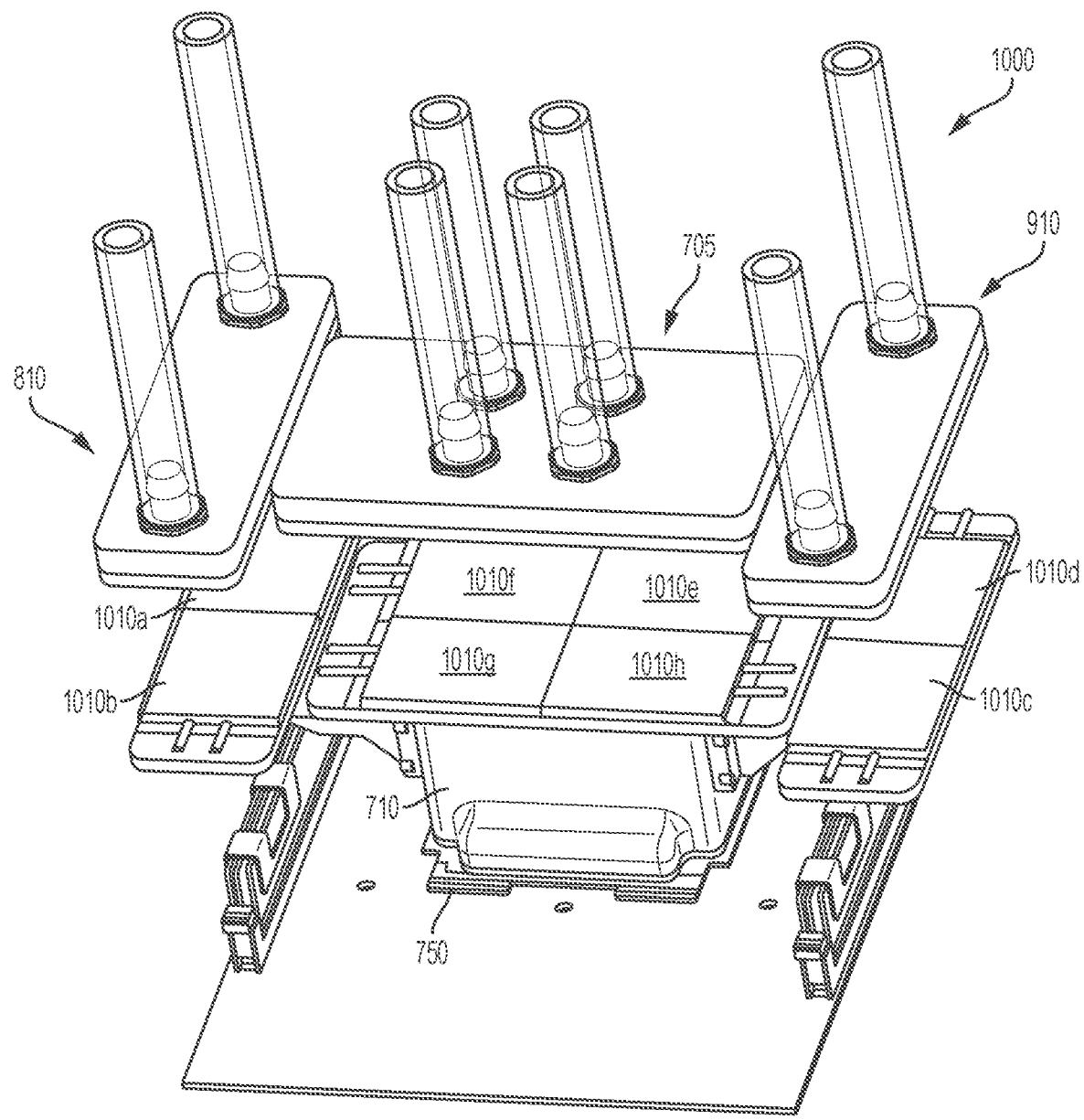
FIG. 10 illustrates a perspective view of an example modular system having a Peltier device in accordance with one or more embodiments of the disclosure.

As mentioned, each of the pedestal member 710 and the modular attachment thermal members 810 and 910 can be driven by Peltier devices. FIG. 10 illustrates a deconstructed perspective view of the modular assembly 1000 showing eight Peltier devices 1010a, 1010b, 1010c, 1010d, 1010e, 1010f, 1010g, 1010h, in accordance with one or more embodiments of the disclosure. In some aspects, each of the modular attachment member 810 and the modular attachment member 910 can leverage about 400 W from the Peltier devices (e.g., device 1010a and device 1010b, and device 1010c and 1010d) in order to remove heat generated by the power dissipated by the semiconductor package 750. Thus, in one example, in a scenario in which an amount of heat generated by 400 W of dissipated package power is to be removed, the modular attachment member 810 and the modular attachment member 910 can provide about 800 W of Peltier device power because, as illustrated in FIG. 10, there can be four Peltier devices 1010a-1110d pairwise mounted on or otherwise coupled to the two modular attachment members 810 and 910.

Figure 11A:
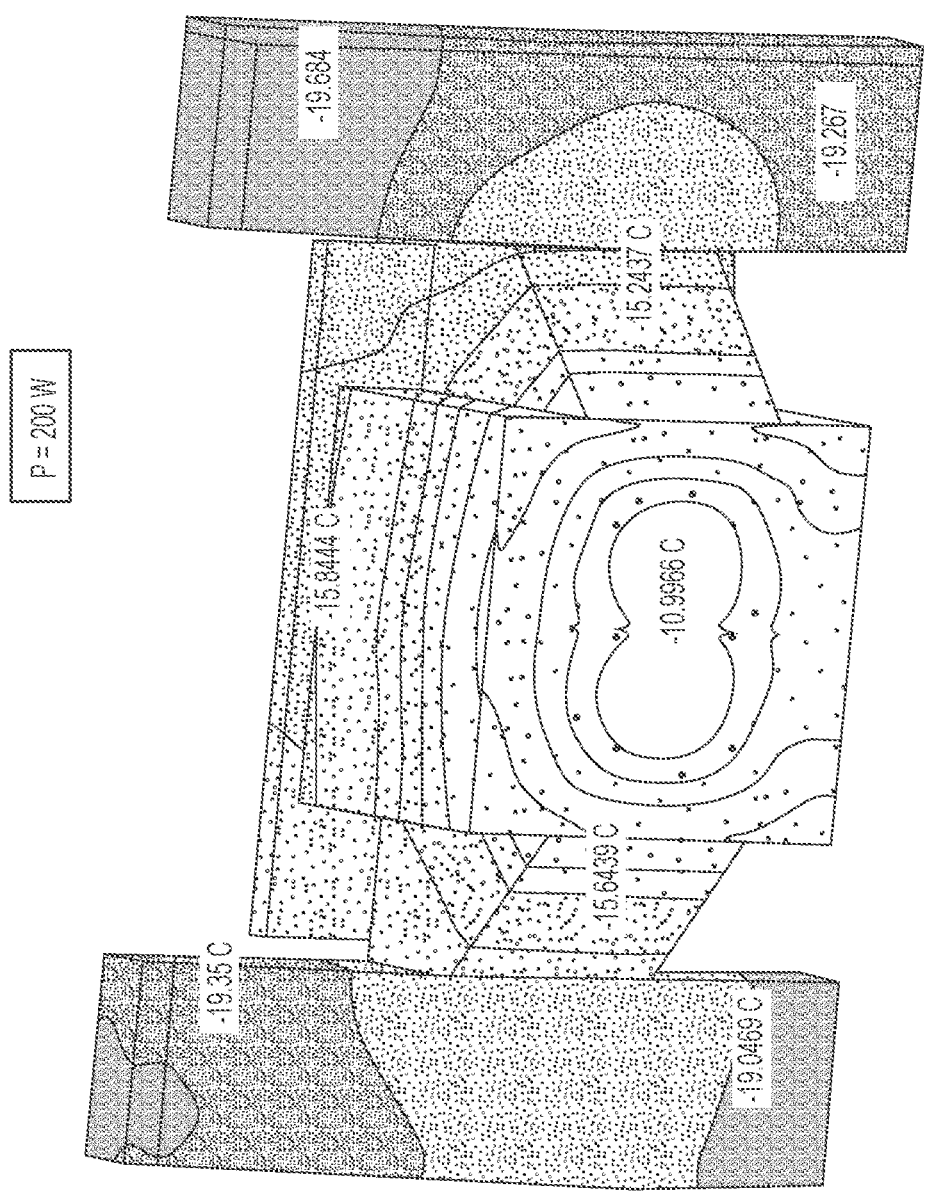
FIG. 11A illustrates an example of a thermal simulation of a modular assembly having two attachment members at a dissipated package power of 200 W in accordance with one or more embodiments of the disclosure. In the illustration of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.
Figure 11B:
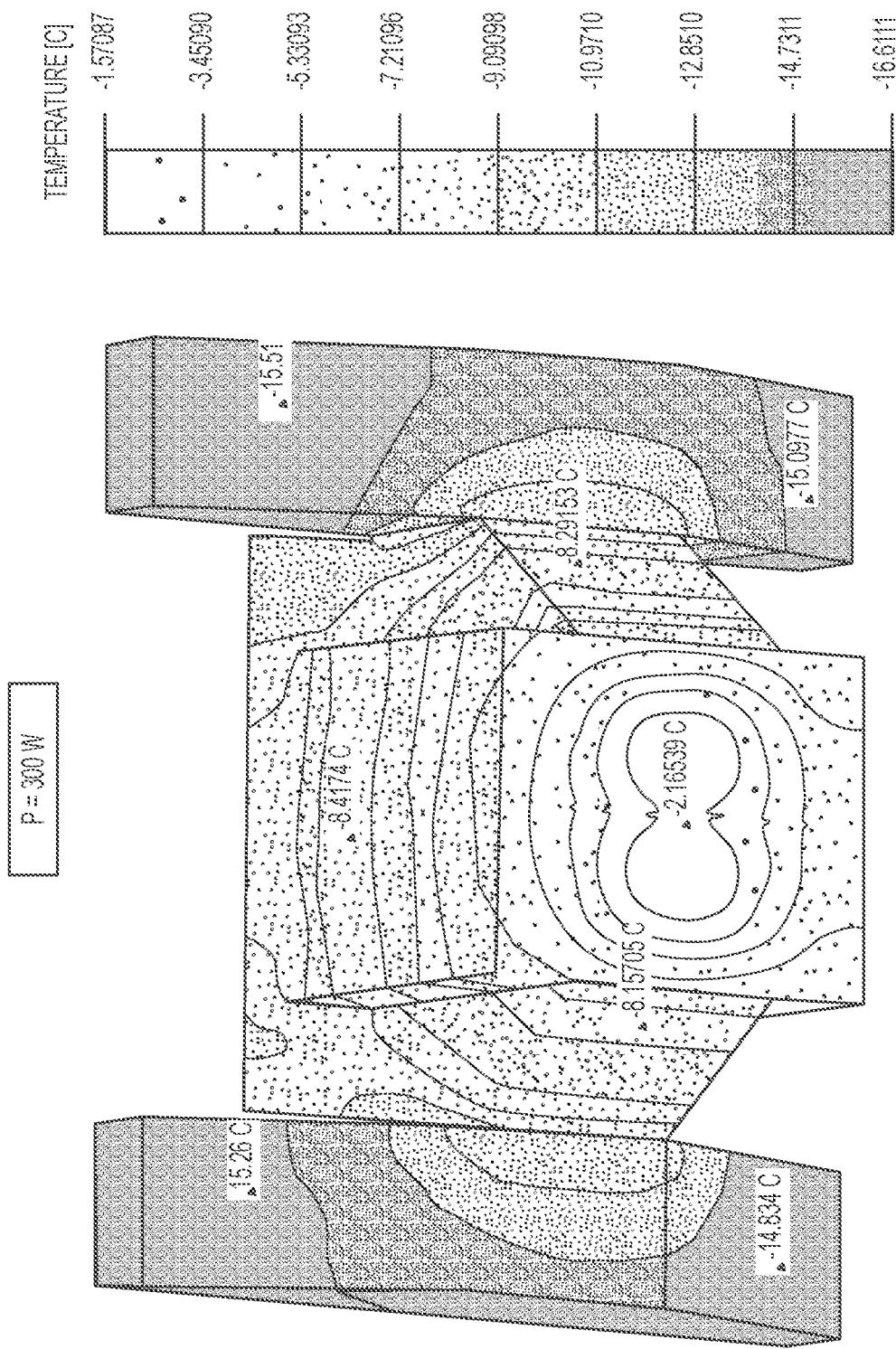
FIG. 11B illustrates an example of a thermal simulation of the modular assembly referred to in FIG. 11A at a dissipated package power of 300 W in accordance with one or more embodiments of the disclosure. In the illustration of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.
Figure 11C:
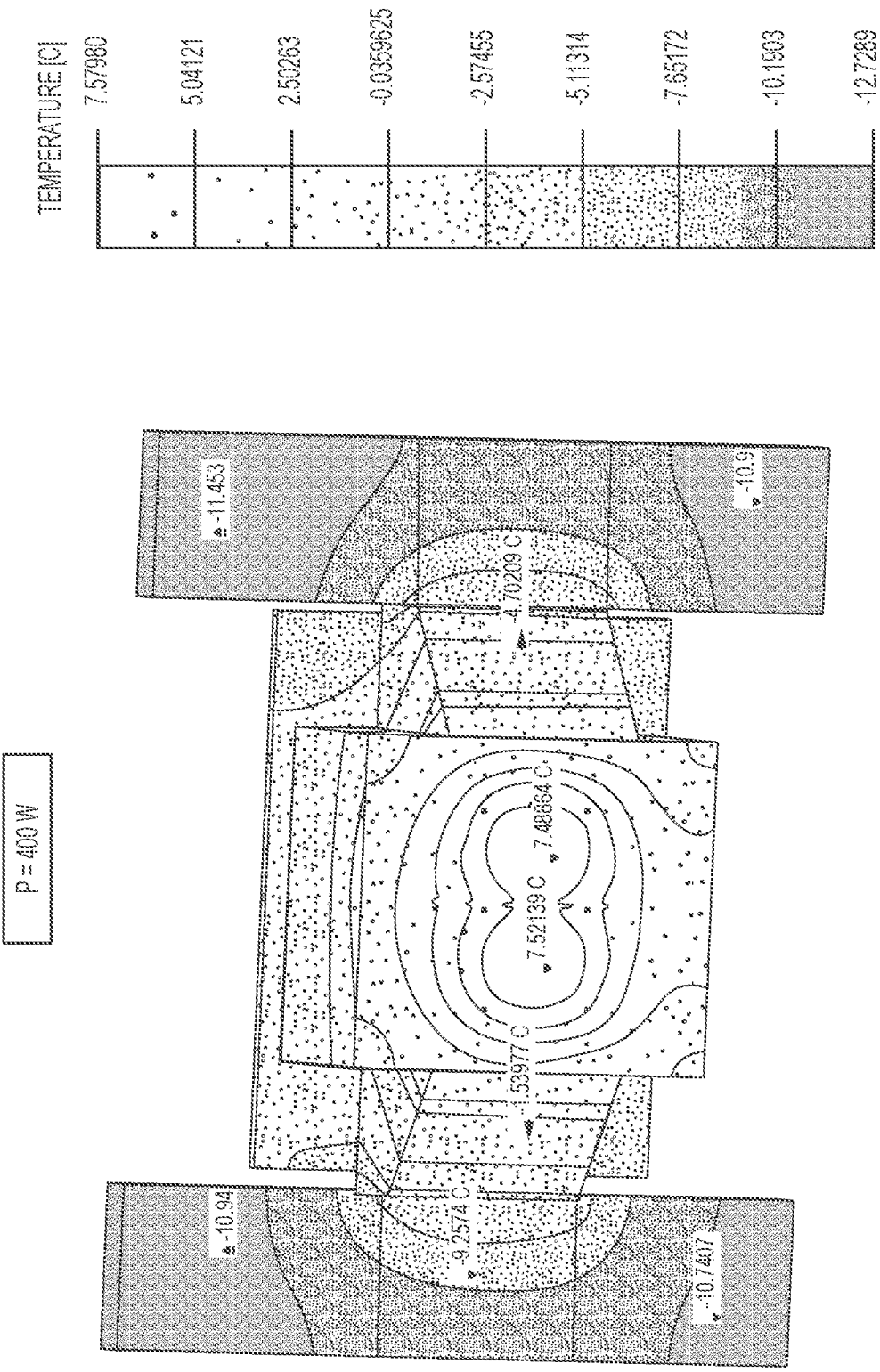
FIG. 11C illustrates an example of thermal simulation of the modular assembly referred to in FIG. 11A at a dissipated package power of 400 W in accordance with one or more embodiments of the disclosure. In the illustration of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

In some implementations, a modular assembly having two modular attachment members (e.g., modular assembly 900 having members 810 and 910) can be utilized for dissipated package power in the range from about 200 W to about 400 W in order to fulfill a defined temperature specification. The modular attachment member also can be referred to as modular thermal attachment members. FIGS. 11A-11C illustrate results of respective thermal simulations of such a modular assembly for dissipated package powers of 200 W, 300 W, and 400 W.

Without intending to bound or otherwise limited by theory and/or simulation, FIGS. 7A-7B and FIGS. 11A-11C demonstrate the modularity and temperature scalability of the thermal solutions provided in the present disclosure.

Figure 12A:
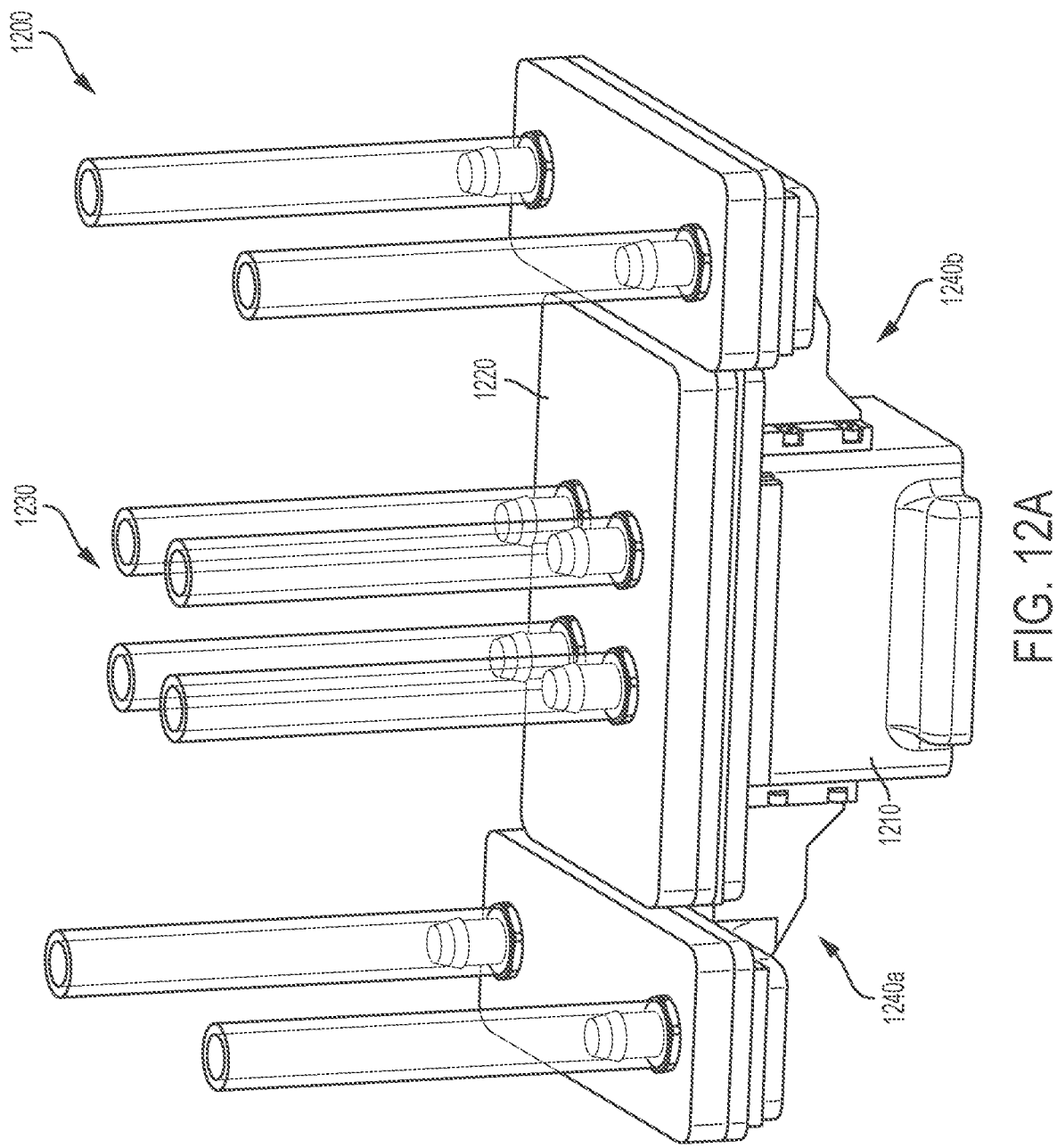
FIG. 12A illustrates an example of modular assembly for thermal management of a semiconductor package including a dual die arrangement, in accordance with one or more embodiments of the disclosure.

FIG. 12A illustrates an example of a modular assembly 1200 for thermal management of a dissipative semiconductor package in accordance with one or more embodiments of the disclosure. The modular assembly 1200 includes a pedestal member 1210 and a cold plate 1220 coupled to tubing 1230 in accordance with aspects described herein. The modular assembly 1200 also includes a modular attachment member 1240a removably and a modular attachment member 1240b, each of which members is coupled (e.g., removably mechanically coupled and/or thermally coupled) to the pedestal member 1210. In contrast to other modular assemblies described herein, the modular assembly 1200 does not include or otherwise rely on a Peltier device. The structure of each of the modular attachment member 1240a and the modular attachment member 1240b can be the same as or similar to the modular attachment member 400 disclosed herein, with exception of the Peltier device(s) that are present in the modular attachment member 400.

FIG. 12B illustrates an example of simulation results of the thermal performance of the modular assembly 1200 shown in FIG. 12A, in accordance with one or more embodiments of the disclosure. In one aspect, the simulation was conducted with a package power of 1 kW, without reliance on Peltier devices, in order to study and illustrate the passive cooling power of the modular assembly 1200 in a scenario in which the pedestal member 1210 and both modular attachment members 1240a and 1240b are water-cooled. In another aspect, in the simulation, coolant inlet fluid temperature is assumed to be 16° C. and flow rate is 3 gallons per minute, both magnitudes that correspond to typical use case for process chilled water. As it can be gleaned from the simulation results, the pedestal member 1210 (e.g., a copper block mounted on or otherwise coupled to the top of a semiconductor package in accordance with aspects of this disclosure) has a predicted temperature $T_P$ (a real number) of about 51° C. in the vicinity of two sources of heat (e.g., two semiconductor dies in a dual die arrangement) in the semiconductor package that dissipates the package power of 1 kW.

Figure 13:
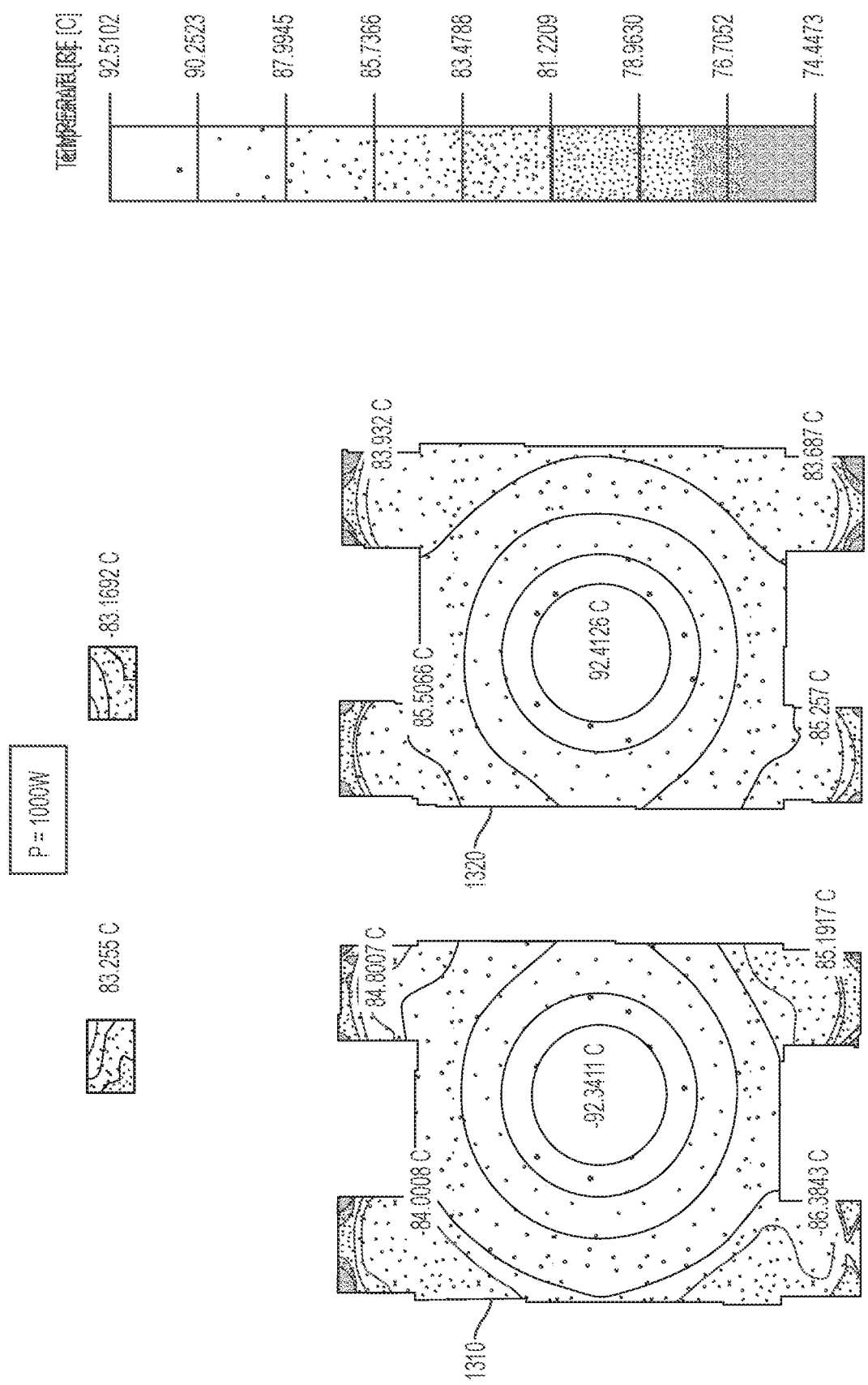
FIG. 13 illustrates an example of a thermal simulation of the semiconductor package cooled by the modular assembly shown in FIG. 12A, in accordance with one or more embodiments of the disclosure. In the illustration of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

In addition, FIG. 13 illustrates an example of other simulation results included in the thermal simulation of the semiconductor package in connection with FIG. 12A. More specifically, the simulation results illustrated in FIG. 13 present predicted temperatures at a surface (or plane) of a semiconductor die arranged in a dual die configuration. It is noted that such surface includes a portion of a power distribution network (e.g., power contacts) coupled to respective semiconductor dies in the dual die arrangement. As illustrated in FIG. 13, it can be gleaned from the simulation results that the predicted package junction temperature is about 92° C. for both semiconductor dies (the corresponding surfaces labeled 1310 and 1320 in FIG. 13) included in dual die arrangement in the simulated semiconductor package. As further illustrated, the junction temperature at the shown portion of the power contacts (at the top of the panel) is about 83° C. Such a junction temperature is within an acceptable range for a package power of 1 kW. It is noted that the modular assembly 1200 also can be utilized at dissipation powers less than 1 kW, with similar or greater performance.

Figure 14:
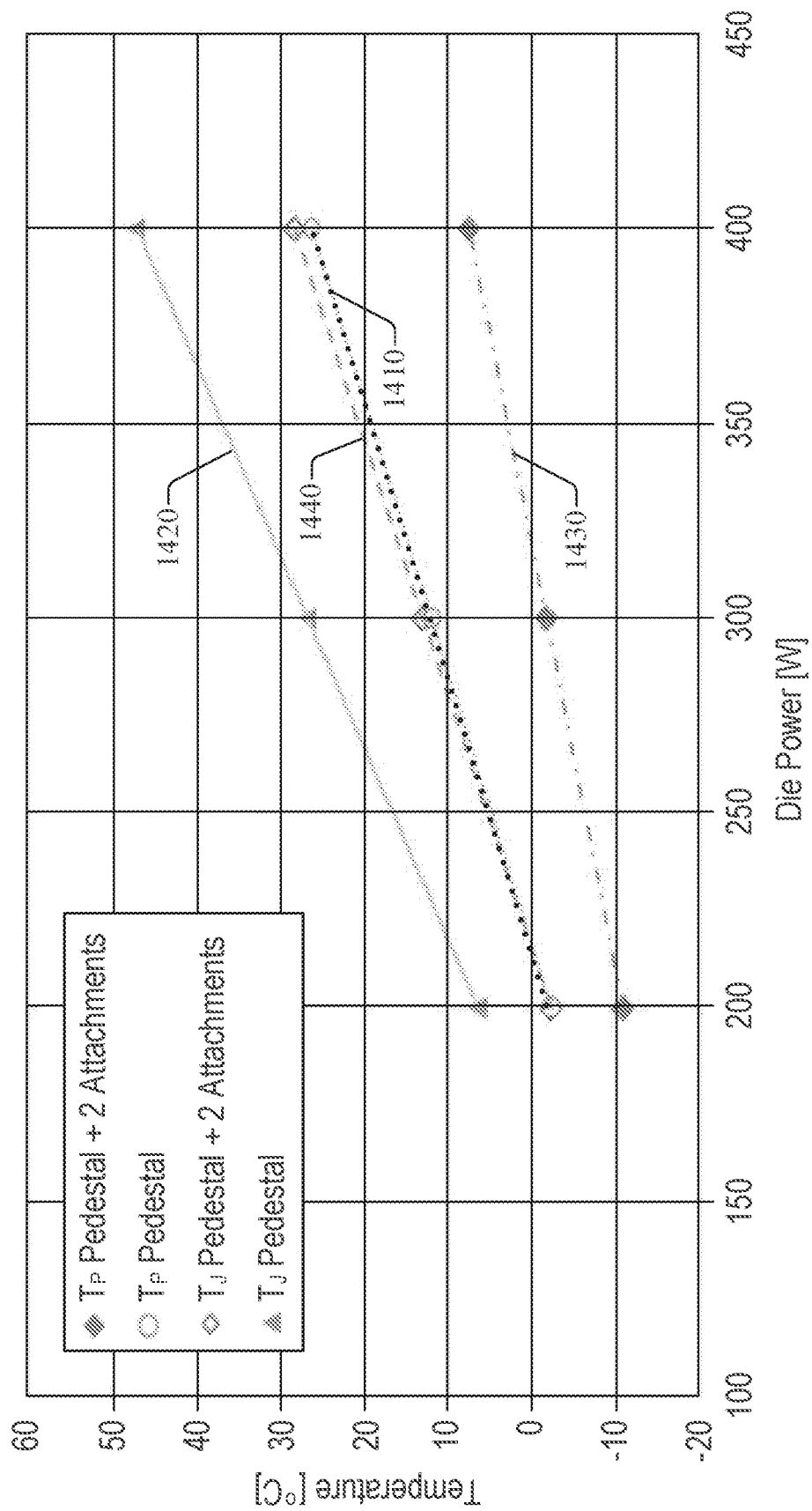
FIG. 14 illustrates simulation results representative of thermal performance of example thermal control systems in accordance with one or more embodiments of the present disclosure. In the illustration of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.
Figures 15, 16:
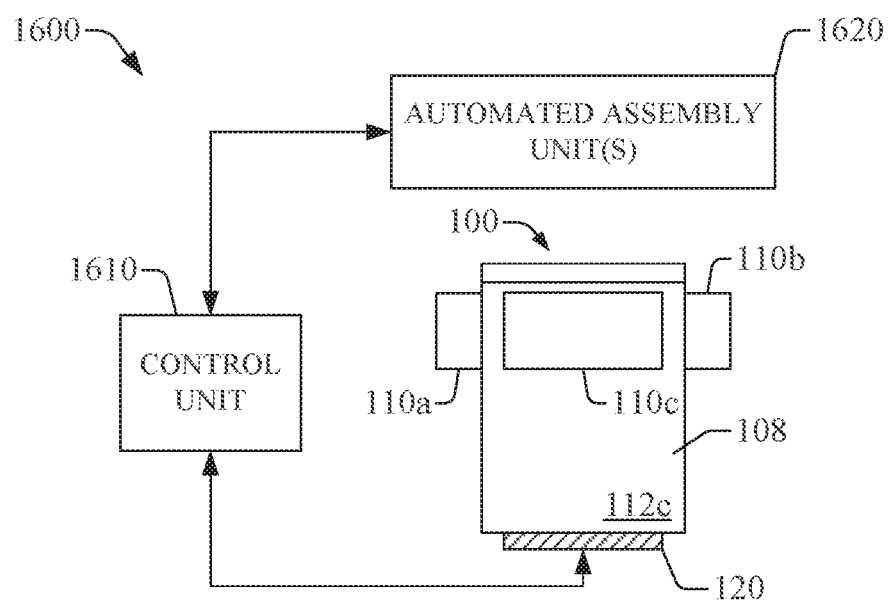
FIG. 15 illustrates predicted temperatures obtained from the simulation results in accordance with the one or more embodiments referred to in FIG. 14.
FIG. 16 illustrates an example of a system for configuring a modular assembly for thermal control of a semiconductor package in accordance with one or more embodiments of the disclosure.

FIG. 14 illustrates simulation results representative of thermal performance of example thermal control systems in accordance with one or more embodiments of the present disclosure. More specifically, the simulation results are representative of temperature $T_P$ (a real number) of a pedestal member and junction temperature $T_J$ (a real number) at a surface of a semiconductor die within a semiconductor package in contact with another surface of a pedestal member (e.g., pedestal member 310 in FIG. 3). The simulated semiconductor die is embodied in a dual-die central processing unit (CPU). The simulations contemplate two scenarios: (i) thermal control systems including the pedestal member, without attachment members coupled thereto, and the semiconductor die dissipating an amount of power P (a real number, labeled as "die power" in FIG. 14) and (ii) other thermal control systems including the pedestal member having two attachment members coupled thereto, and the semiconductor die dissipating the amount of power P. Therefore, four sets of results are shown in FIG. 14: (1) Solid diamonds and open diamonds representing, respectively, $T_P$ and $T_J$ in the scenario in which two attachment members are coupled to the pedestal member; and (2) solid circles and solid triangles representing, respectively, $T_P$ and $T_J$ in the other scenario in which the pedestal member is the only element that can remove heat from the semiconductor package containing the semiconductor die. The simulation results convey that $T_P$ and $T_J$ increase essentially linearly with die power. As such, each of the four sets of simulation results can be fit to a linear function. Specifically, in the scenario in which attachment members are absent, the following functions can be determined via a linear regression: $T_P^{(0)}=0.1422P-30.545$, represented by trace 1410, and $T_J^{(0)}=0.2032P-34.153$, represented by trace 1420. In the scenario in which two attachment members are coupled to the pedestal member, the following relationships can be determined via a linear regression: $T_P^{(2)}=0.0915P-29.020$, represented by trace 1430, and $T_J^{(2)}=0.1525P-32.638$, represented by trace 1440. As it can be gleaned from the simulation results shown in FIG. 13, at the largest simulated die power of 400 W, a difference $\Delta T=T_J-T_P$ of about 20° C. is predicted or otherwise determined for the junction temperature and the pedestal member temperature. FIG. 15 presents example predicted temperatures $T_P$ and $T_J$ for each of the foregoing simulated scenarios.

FIG. 16 illustrates an example of a system 1600 for configuring a modular assembly for thermal control of a semiconductor package in accordance with one or more embodiments of the disclosure. The example system 1600 includes a control unit 1610 that is functionally coupled to integrated circuitry contained within the semiconductor package 120. The control unit 1610 can monitor operational condition of the integrated circuitry. In addition or in the alternative, the control unit 1610 can configure the operation of the integrated circuitry. For instance, the control unit 1610 can energize (e.g., cause to transition from a power-save state to a power-on state) a portion of the integrated circuitry and/or de-energize (e.g., cause to transition from a power-on state to a power-save state) another portion of the integrated circuitry. The control unit 1610 can be embodied in or can include, for example, a PLC or another type of computing device that can implement or otherwise execute defined control logic. In some aspects, the control unit 1610 can execute at least a portion of the defined control logic to control the operation of one or more Peltier devices in accordance with aspects of this disclosure, such as a Peltier device that can be included in the cooling tower 100 and/or the attachment members 110a-110c.

In some scenarios, the control unit 1610 can access data indicative of power dissipated at the integrated circuitry contained within the semiconductor package 120, and can determine a change in the package power. The control unit 1610 can perform such a determination continuously, nearly continuously, periodically, according to a schedule, and/or based on one or more defined events. Regardless of the manner in which the determination is made, the control unit 1610 can determine that the package power increased from a first power to a second power greater than the first power by a defined amount (e.g., a threshold). In response, the control unit 1610 can direct the automated assembly unit(s) 1620 to add an attachment member to the cooling tower 100. To that end, in one example, the control unit 1610 can determine the attachment member to be added and can identify the attachment member to the automated assembly unit(s) 1620. The automated assembly unit(s) 1620 can access the attachment member and can removably couple (e.g., reversibly mount) the attachment member (e.g., attachment member 400) to a side surface of the cooling tower 100.

In other scenarios, the control unit 1610 can determine that package power decreased by a defined amount (e.g., a threshold amount) and, in response, can direct the automated assembly unit(s) 1620 to remove an attachment member from the cooling tower 100. As such, the control unit 1610 can identify the attachment member to be removed and can send information that identifies the attachment member to the automated assembly unit(s) 1620. An automated assembly unit of the automated assembly unit(s) 1620 can reversibly decouple (e.g., reversibly dismount) the attachment member from the cooling tower 100.

While the control unit 1610 and the automated assembly unit(s) 1620 are illustrated as separate units, the disclosure is not so limited and, in some embodiments, the control unit 1610 and at least one of the automated assembly unit(s) 1620 can be integrated into a single unit.

Figure 17:
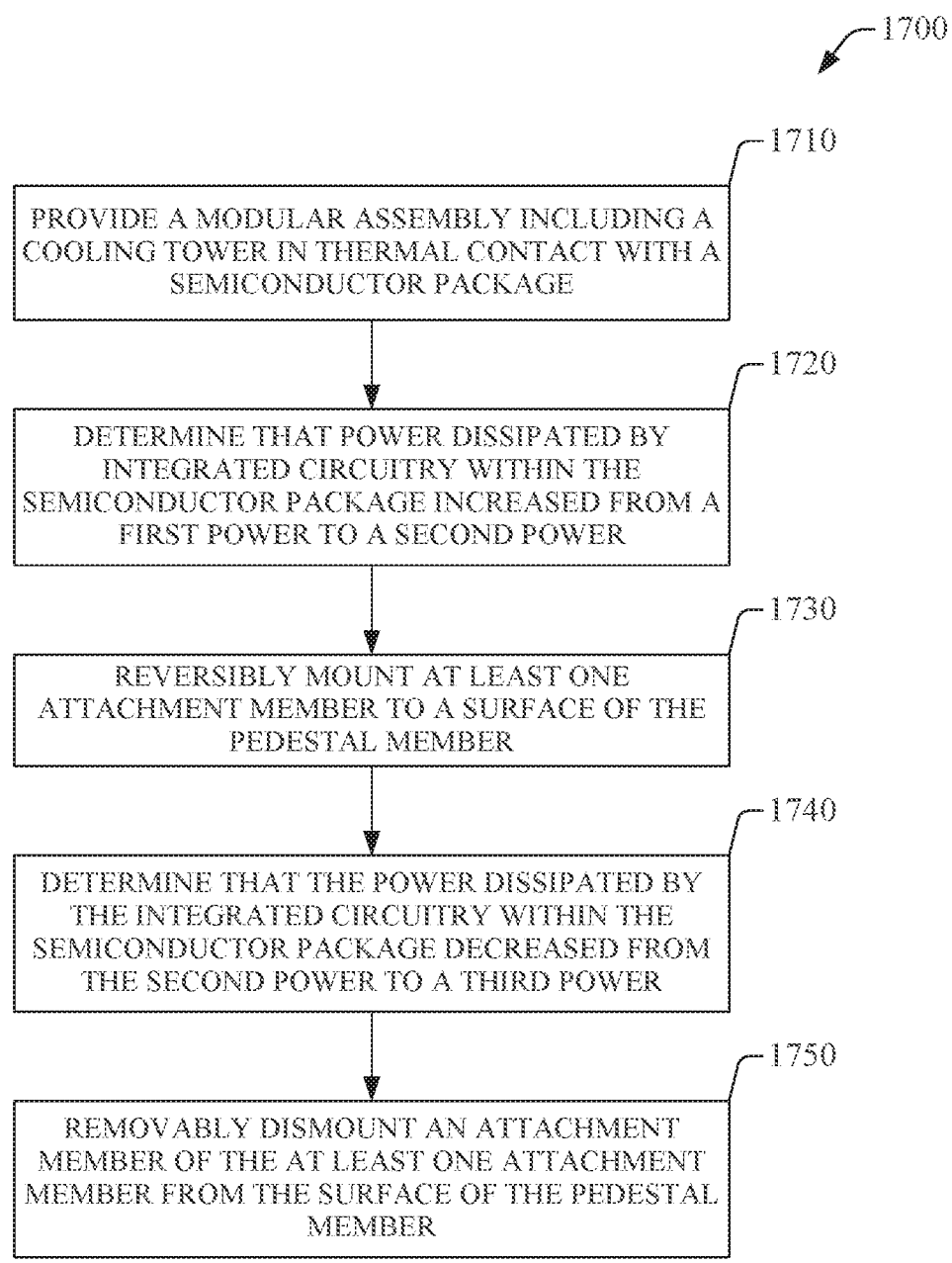
FIG. 17 illustrates an example method for configuring a modular assembly for thermal control of a semiconductor package in accordance with one or more embodiments of the disclosure.

FIG. 17 illustrates a flowchart of an example method 1700 for configuring a modular assembly for thermal control of a semiconductor package in accordance with one or more embodiments of the disclosure. The example method 1700 can be implemented by a controller device (e.g., the control unit 1610) and assembly equipment (e.g., at least one of the automated assembly unit(s) 1620), individually or in combination. At block 1710, a modular assembly including a cooling tower (e.g., cooling tower 100) in thermal contact with the semiconductor package can be provided. In some embodiments, the cooling tower can include a pedestal member (e.g., pedestal member 310 or pedestal member 710) that is mechanically coupled and thermally coupled to the semiconductor package (e.g., semiconductor package 120 or semiconductor package 750). At block 1720, the controller device can determine that power dissipated by the integrated circuitry contained within the semiconductor package increased from a first power (e.g., 200 W) to a second power (e.g., 400 W). To that end, in some implementations, the controller device can monitor the power dissipated by the integrated circuitry. For example, the controller device can poll the integrated circuitry continuously, nearly continuously, or at certain times (e.g., periodically, according to a schedule, or based on event(s)) in order to access data indicative or otherwise representative of power dissipated by the integrated circuitry. The controller device can determine a change in dissipated power based at least on an analysis of at least a portion of such data. At block 1730, the assembly equipment (e.g., a robotic arm) can reversibly mount at least one attachment member to a surface of the pedestal member. In one implementation, the controller device can determine the at least one attachment member to be mounted on the modular assembly based at least on the magnitude of the difference between the second power and the first power. Upon or after such a determination, the controller device can direct the assembly equipment to retrieve or otherwise acquire the at least one attachment member to be mounted to the surface of the pedestal member, and can further direct the assembly equipment to mount the at least one attachment member.

At block 1740, the controller device can determine that power dissipated by the integrated circuitry contained within the semiconductor package decreased from the second power (e.g., 400 W) to a third power (e.g., 300 W). As mentioned, in some implementations, the controller device can monitor the power dissipated by the integrated circuitry. For instance, the controller device can poll the integrated circuitry continuously, nearly continuously, or at certain times (e.g., periodically, according to a schedule, or based on event(s)) in order to access data indicative or otherwise representative of power dissipated by the integrated circuitry. The controller device can determine a change in dissipated power based at least on an analysis of at least a portion of such data. At block 1750, the assembly equipment can reversibly dismount a first attachment member of the least one attachment member from the surface of the pedestal member. In some implementations, the controller device can determine the first attachment member to be removed from the modular assembly based at least on the magnitude of the difference between the second power and the third power. Upon or after such a determination, the controller device can direct the assembly equipment to remove the first attachment member.

According to example embodiments, the disclosure provides an assembly. The assembly may further include a pedestal member having a top surface and a bottom surface opposite to the top surface, the bottom surface configured to receive an amount of heat from a semiconductor package and the pedestal member comprising a first thermally conductive material and; and one or more attachment members removably mounted to respective one or more side surfaces of the pedestal member, each of the one or more attachment members comprising a respective second thermally conductive material and configured to receive a respective second amount of heat from the pedestal member, wherein a number (or quantity) of the one or more attachment members is based at least on a configurable target for power dissipation of the semiconductor package.

Implementation of the example embodiments of such an assembly may include one or more of the following elements. Any one of the first attachment members of the assembly may include a base member removably mounted to a side surface of the one or more side surfaces. The base member may further include a first flange and a second flange substantially orthogonal to the first surface, the first flange defines first openings configured to receive respective first fastening members and the second flange defines second openings configured to received respective second fastening members, wherein at least one of the respective fastening members removably mounts the base member to the pedestal member. The first attachment member of the assembly, wherein the first attachment member has a flat surface, may further comprise a cold plate mounted on the flat surface and defining an inlet opening and an outlet opening, the inlet opening coupled to first tubing and the outlet opening coupled to second tubing, and wherein the first tubing and the second tubing are configured to transport coolant liquid. The first attachment member may further include a Peltier device mounted on the second surface and thermally coupled to the cold plate. The semiconductor package may comprise at least one semiconductor die. The configurable target for the power dissipation may be one of 200 W, 300 W, 400 W, 800 W, or 1000 W. Any one of the first thermally conductive metal or second thermally conductive metal may include copper, aluminum, zinc, or an alloy of two or more of the foregoing metals. Any one of the first thermally conductive metal or second thermally conductive metal may include stainless steel. The assembly may further include a cold plate mechanically coupled to pedestal member, the cold plate thermally coupled to the pedestal member and configured to receive a third amount of heat from the pedestal member. The cold plate may include a first surface defining an inlet opening and an outlet opening, the inlet opening coupled to first tubing and the outlet opening coupled to second tubing, and wherein the first tubing and the second tubing are configured to transport coolant liquid. The assembly may further include a Peltier device mounted on the top surface and thermally coupled to the cold plate.

According to other example embodiments, the disclosure provides another assembly. The assembly may further include a base member having a first flange and a second flange opposite to the first flange and comprising a thermally conductive material, the first flange defining a first plurality of through holes and the second flange defining a second plurality of through holes; and a cold plate mechanically coupled to a first surface of the base member, the first surface substantially orthogonal to a second surface containing the first flange and the second flange.

Implementation of the example embodiments of such an assembly may include one or more of the following elements. A first through hole of the first plurality of through holes may be configured to receive a first fastening member, and wherein a second through hole of the second plurality of through holes may be configured to receive a second fastening member. Any one of the first or second fastening members may include a screw or a bolt. Any one of the first or second holes may include a grooved hole and a screw. The cold plate of the assembly may define an inlet opening and an outlet opening, the inlet opening coupled to first tubing and the outlet opening coupled to second tubing, and wherein the first tubing and the second tubing are configured to transport coolant liquid. The assembly may further include a Peltier device mounted on the first surface and thermally coupled to the cold plate. The thermally conductive material of the assembly may include at least one of copper or stainless steel.

According to further example embodiments, the disclosure provides a method. The method may include providing an assembly comprising a pedestal member in thermal contact with integrated circuitry; determining that power dissipated by the integrated circuitry transitioned from a first power to a second power greater than the first power; reversibly mounting at least one attachment member to a surface of the pedestal member; determining that the power dissipated by the integrated circuitry transitioned from the second power to a third power less than the second power; and reversibly dismounting a first attachment member of the at least one attachment member.

Implementation of the example embodiments of such a method may include one or more of the following elements. The determining that the power dissipated by the integrated circuitry transitioned from the first power to the second power greater than the first power may include monitoring, by a controller device, an operational condition of the integrated circuitry. The reversibly mounting may include receiving, at automated assembly equipment, information indicative of the at least one attachment member; and receiving, at the automated assembly equipment, an instruction to add a second attachment member of the at least one attachment member. The reversibly mounting may include receiving, at the automated assembly equipment, second information indicative of the first attachment member; and receiving, at the automated assembly equipment, a second instruction to remove the second attachment member of the at least one attachment member.

According to still other example embodiments, the disclosure provides a system. The system can include a semiconductor package including one or more semiconductor dies having integrated circuitry, the one or more semiconductor dies configured to dissipate a defined level of power; and a modular assembly thermally coupled to the semiconductor package and configured to receive an amount of heat from the semiconductor package, the modular assembly comprising, a pedestal member having a top surface and a bottom surface opposite to the top surface, the pedestal member comprising a first thermally conductive material, wherein the bottom surface configured to receive the amount of heat; and one or more attachment members removably mounted to respective one or more side surfaces of the pedestal member, each of the one or more attachment members comprising a respective second thermally conductive material and configured to receive a respective second amount of heat from the pedestal member, wherein a number of the one or more attachment members is based at least on the defined level of power.

Implementation of the example embodiments of such a system can include one or more of the following. A first attachment member of the one or more attachment members can include a base member removably mounted to a side surface of the one or more side surfaces. The base member can include a first flange and a second flange substantially orthogonal to the first surface, the first flange defines first openings configured to receive respective first fastening members and the second flange defines second openings configured to received respective second fastening members. The system also can include the respective first fastening members and the respective second fastening members, where at least one of the respective fastening members removably mounts the base member to the pedestal member. The first attachment member can have a flat surface, and the first attachment member can further include a cold plate mounted on the flat surface and defining an inlet opening and an outlet opening, the inlet opening coupled to first tubing and the outlet opening coupled to second tubing, where the first tubing and the second tubing are configured to transport coolant liquid. The first attachment member can further include a Peltier device mounted on the second surface and thermally coupled to the cold plate. The semiconductor package can include at least one semiconductor die. The configurable target for power dissipation is one of 200 W, 300 W, 400 W, 500 W, 600 W, 700 W, 800 W, 900 W, or 1000 W. The first thermally conductive material includes copper, aluminum, zinc, or an alloy of two or more of the foregoing metals, and the second thermally conductive material includes copper, aluminum, zinc, or an alloy of two or more of the foregoing metals. The first thermally conductive material includes stainless steel, and the second thermally conductive material includes stainless steel. The system can further include a cold plate mechanically coupled to pedestal member, the cold plate thermally coupled to the pedestal member and configured to receive a third amount of heat from the pedestal member. The cold plate includes a first surface defining an inlet opening and an outlet opening, the inlet opening coupled to first tubing and the outlet opening coupled to second tubing, and the first tubing and the second tubing are configured to transport coolant liquid. The system can further include a Peltier device mounted on the top surface and thermally coupled to the cold plate.

As mentioned, unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including matters of logic with respect to arrangement of steps or operational flow; plain meaning derived from grammatical organization or punctuation; the number or type of embodiments described in the specification or annexed drawings; or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein is generally intended to include deposition of material or photoresist, patterning, exposure, development, etching, cleaning, ablating, polishing, and/or removal of the material or photoresist as required in forming a described structure.

What has been described herein in the present specification and annexed drawings includes examples of modular assemblies and modular systems that can permit or otherwise facilitate management of heat dissipation and/or temperature control. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. An assembly, comprising:
   a pedestal member having a first surface and a second surface opposite to the first surface, the second surface to receive an amount of heat from a semiconductor package and the pedestal member comprising a first thermally conductive material; and
   one or more attachment members removably mounted to respective one or more side surfaces of the pedestal member, each of the one or more attachment members comprising a respective second thermally conductive material and to receive a respective second amount of heat from the pedestal member;
   a control unit configured to identify a number of the one or more attachment members to be removably mounted to the respective one or more side surfaces of the pedestal member, wherein the number of the one or more attachment members is based at least on a configurable target for power dissipation of the semiconductor package; wherein a first attachment member of the one or more attachment members comprises a base member removably mounted to a side surface of the one or more side surfaces, and wherein the base member comprises a first flange and a second flange substantially orthogonal to the first surface, the first flange defines first openings to receive respective first fastening members and the second flange defines second openings to received respective second fastening members.

2. The assembly of claim 1, further comprising the respective first fastening members and the respective second fastening members, wherein at least one of the respective fastening members removably mounts the base member to the pedestal member.

3. The assembly of claim 1, wherein the first attachment member has a flat surface, and
   wherein the first attachment member further comprises a cold plate mounted on the flat surface and defining an inlet opening and an outlet opening, the inlet opening coupled to first tubing and the outlet opening coupled to second tubing, and wherein the first tubing and the second tubing are configured to transport coolant liquid.

4. The assembly of claim 3, wherein the first attachment member further comprises a Peltier device mounted on the second surface and thermally coupled to the cold plate.

5. The assembly of claim 4, further comprising a Peltier device mounted on the first surface and thermally coupled to the cold plate.

6. The assembly of claim 1, wherein the semiconductor package comprises at least one semiconductor die.

7. The assembly of claim 1, wherein the configurable target for power dissipation is one of 200 W, 300 W, 400 W, 500 W, 600 W, 700 W, 800 W, 900 W, or 1000 W.

8. The assembly of claim 1, wherein the first thermally conductive material comprises copper, aluminum, zinc, or an alloy of two or more of the foregoing metals, and wherein the second thermally conductive material comprises copper, aluminum, zinc, or an alloy of two or more of the foregoing metals.

9. The assembly of claim 1, wherein the first thermally conductive material comprises stainless steel, and wherein the second thermally conductive material comprises stainless steel.

10. The assembly of claim 1, further comprising a cold plate mechanically coupled to the pedestal member, the cold plate thermally coupled to the pedestal member and to receive a third amount of heat from the pedestal member.

11. The assembly of claim 10, wherein the cold plate comprises a first surface defining an inlet opening and an outlet opening, the inlet opening coupled to first tubing and the outlet opening coupled to second tubing, and wherein the first tubing and the second tubing are configured to transport coolant liquid.

12. An assembly, comprising:
    a base member having a first flange and a second flange opposite to the first flange and comprising a thermally conductive material, the first flange defining a first plurality of through holes and the second flange defining a second plurality of through holes;
    a cold plate mechanically coupled to a first surface of the base member, the first surface substantially orthogonal to a second surface containing the first flange and the second flange, wherein the cold plate defines a first inlet opening and a second outlet opening, the first inlet opening coupled to first tubing and the second outlet opening coupled to second tubing, and wherein the first tubing and the second tubing are configured to transport coolant liquid; and
    one or more attachment members removably mounted to respective one or more side surfaces of a pedestal member attached to the second surface of the base member, each of the one or more attachment members defines a third inlet opening and a fourth outlet opening, the third inlet opening coupled to third tubing and the fourth outlet opening coupled to fourth tubing, and wherein the third tubing and the fourth tubing are configured to transport additional coolant liquid.

13. The assembly of claim 12, wherein a first through hole of the first plurality of through holes is configured to receive a first fastening member, and wherein a second through hole of the second plurality of through holes is configured to receive a second fastening member.

14. The assembly of claim 13, wherein the first fastening member comprises one of a first screw or a first bolt, and wherein the second fastening member comprises one of a second screw or a second bolt.

15. The assembly of claim 13, wherein the first through hole is a first grooved hole and the first fastening member comprises a first screw, and wherein the second through hole is a second grooved hole and the second fastening member comprises a second screw.

16. The assembly of claim 12, further comprising a Peltier device mounted on the first surface and thermally coupled to the cold plate.

17. The assembly of claim 12, wherein the thermally conductive material comprises at least one of copper or stainless steel.

* * * * *